(12) United States Patent
Kim et al.

(10) Patent No.: US 12,369,264 B2
(45) Date of Patent: Jul. 22, 2025

(54) ELECTRONIC DEVICE HAVING FLEXIBLE DISPLAY

(71) Applicant: SAMSUNG ELECTRONICS CO., LTD., Suwon-si (KR)

(72) Inventors: Hyungsoo Kim, Suwon-si (KR); Jaeho Kang, Suwon-si (KR); Jungjin Kim, Suwon-si (KR); Minsung Lee, Suwon-si (KR); Iksu Jung, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 120 days.

(21) Appl. No.: 18/171,937

(22) Filed: Feb. 21, 2023

(65) Prior Publication Data

US 2023/0209750 A1    Jun. 29, 2023

Related U.S. Application Data

(63) Continuation of application No. PCT/KR2021/010676, filed on Aug. 11, 2021.

(30) Foreign Application Priority Data

Sep. 1, 2020    (KR) .................. 10-2020-0111125

(51) Int. Cl.
*H05K 5/02*    (2006.01)
*G06F 1/16*    (2006.01)
(Continued)

(52) U.S. Cl.
CPC ......... *H05K 5/0217* (2013.01); *G06F 1/1624* (2013.01); *G06F 1/1637* (2013.01);
(Continued)

(58) Field of Classification Search
CPC .... G06F 1/1601; G06F 1/1615; G06F 1/1624; G06F 1/1637; G06F 1/1652;
(Continued)

(56) References Cited

U.S. PATENT DOCUMENTS

| | | | |
|---|---|---|---|
| 7,426,107 B2* | 9/2008 | Yeh ...................... | G06F 1/1626 345/170 |
| 8,711,566 B2* | 4/2014 | O'Brien ................ | G06F 1/1652 361/724 |

(Continued)

FOREIGN PATENT DOCUMENTS

| CN | 108259649 A | 7/2018 |
|---|---|---|
| CN | 110047385 A | 7/2019 |

(Continued)

OTHER PUBLICATIONS

European Search Report for European Patent Application No. 21864550.5 1224/4191366 PCT/KR2021010676 dated Jan. 5, 2024.
(Continued)

*Primary Examiner* — Rockshana D Chowdhury
*Assistant Examiner* — Martin Antonio Asmat Uceda
(74) *Attorney, Agent, or Firm* — CANTOR COLBURN LLP

(57) ABSTRACT

An electronic device includes a flexible display slidably coupled to a housing and including a first portion exposed outside the housing and a second portion connected to the first portion and both extendable out of and retractable into the housing together with sliding of the first portion, a first roller inside the housing and rotatable about a first shaft having a radius of curvature, and a second roller which is inside the housing, rotatable about a second shaft spaced apart from the first shaft and being further from the end portion of the housing than the first shaft. Retraction of the flexible display into the housing extends the second portion (Continued)

of the flexible display along the first roller to have a curvature corresponding the radius of curvature of the first roller, together with the second portion of the flexible display being extended along the second roller.

20 Claims, 43 Drawing Sheets

(51) Int. Cl.
*G09F 9/30* (2006.01)
*H02J 7/00* (2006.01)
(52) U.S. Cl.
CPC ............ *G06F 1/1652* (2013.01); *G09F 9/301* (2013.01); *G06F 2203/04102* (2013.01); *H02J 7/0042* (2013.01)
(58) Field of Classification Search
CPC ............ G06F 2203/04102; G09F 9/301; H02J 7/0042; H04M 1/0237; H05K 5/0217
See application file for complete search history.

(56) References Cited

U.S. PATENT DOCUMENTS

| | | | |
|---|---|---|---|
| 10,015,897 B1* | 7/2018 | Hong | H04M 1/0268 |
| 10,691,172 B2* | 6/2020 | Jovanovic | H10K 77/111 |
| 10,742,784 B1* | 8/2020 | Jo | H04M 1/0268 |
| 10,747,269 B1* | 8/2020 | Choi | G06F 1/1652 |
| 10,878,728 B2* | 12/2020 | Yoon | G06F 1/1624 |
| 10,893,130 B1* | 1/2021 | Song | H04M 1/0237 |
| 10,963,014 B1* | 3/2021 | Park | H04B 1/3827 |
| 11,003,219 B1* | 5/2021 | Kim | G06F 1/1652 |
| 11,012,546 B1* | 5/2021 | Song | G06F 1/1656 |
| 11,194,363 B2* | 12/2021 | Kim | G06F 1/1637 |
| 11,240,923 B2* | 2/2022 | Wang | H05K 5/0217 |
| 11,310,925 B2* | 4/2022 | Kim | G06F 1/1637 |
| 11,343,361 B2* | 5/2022 | He | H04M 1/0237 |
| 11,375,628 B2* | 6/2022 | Zhang | G06F 1/1616 |
| 11,793,061 B2* | 10/2023 | Cai | H10K 59/8791 361/807 |
| 11,842,659 B2 | 12/2023 | Khachatryan et al. | |
| 11,910,549 B2* | 2/2024 | Ko | G06F 1/1624 |
| 11,966,258 B2* | 4/2024 | Sun | G06F 1/1652 |
| 12,158,777 B2* | 12/2024 | Feng | H04M 1/0235 |
| 2013/0058063 A1 | 3/2013 | O'Brien | |
| 2014/0211399 A1 | 7/2014 | O'Brien | |
| 2016/0320804 A1 | 11/2016 | Takayanagi et al. | |
| 2017/0212556 A1 | 7/2017 | Jovanovic | |
| 2018/0049328 A1 | 2/2018 | Choi et al. | |
| 2020/0033913 A1 | 1/2020 | Yang | |
| 2020/0257335 A1 | 8/2020 | Kim et al. | |
| 2020/0264660 A1 | 8/2020 | Song et al. | |
| 2021/0044683 A1 | 2/2021 | He et al. | |
| 2021/0076517 A1 | 3/2021 | Wang et al. | |
| 2021/0219437 A1 | 7/2021 | Kim et al. | |
| 2021/0272486 A1 | 9/2021 | Khachatryan et al. | |
| 2022/0039273 A1 | 2/2022 | Zhang | |
| 2022/0317736 A1* | 10/2022 | Li | G06F 1/1624 |
| 2022/0326737 A1* | 10/2022 | Ran | G06F 1/1652 |
| 2022/0337688 A1* | 10/2022 | Sang | G06F 1/1652 |

FOREIGN PATENT DOCUMENTS

| | | |
|---|---|---|
| CN | 110706598 A | 1/2020 |
| CN | 111243438 A | 6/2020 |
| EP | 4102489 A1 | 12/2022 |
| IN | 113132512 A | 7/2021 |
| JP | 09160506 A | 6/1997 |
| KR | 1020140059274 A | 5/2014 |
| KR | 1020160129668 A | 11/2016 |
| KR | 1020170008610 A | 1/2017 |
| KR | 1020180018941 A | 2/2018 |
| KR | 20190062855 A | 6/2019 |
| KR | 1020190077107 A | 7/2019 |
| KR | 1020190143029 A | 12/2019 |
| KR | 20200006645 A | 1/2020 |
| KR | 1020200013821 A | 2/2020 |
| KR | 20200099054 A | 8/2020 |
| KR | 1020200099455 A | 8/2020 |
| KR | 1020210084187 A | 7/2021 |
| WO | 2019153818 A1 | 8/2019 |
| WO | 2020013390 A1 | 1/2020 |

OTHER PUBLICATIONS

European Search Report for European Patent Application No. 21864550.5 dated Apr. 23, 2024.
Korean Office Action for Korean Patent Application No. KR10-2020-0111125 dated Dec. 20, 2024.

* cited by examiner

<Extended State>

ELECTRONIC DEVICE HAVING FLEXIBLE DISPLAY

CROSS-REFERENCE TO RELATED APPLICATIONS

This application is a continuation application of International Application No. PCT/KR2021/010676 designating the United States, filed on Aug. 11, 2021, at the Korean Intellectual Property Receiving Office and claiming priority to Korean Patent Application No. 10-2020-0111125 filed on Sep. 1, 2020, at the Korean Intellectual Property Office, the disclosures of which are incorporated by reference herein in their entireties.

BACKGROUND

1) Field

Various embodiments disclosed in the disclosure relate to a technique for an electronic device including a flexible display.

2) Description of the Related Art

An electronic device may include a transformable rollable type electronic device (hereinafter, a 'rollable electronic device'), when used, capable of extending or reducing a display region of a display. The rollable electronic device may include a first housing and second housing (or slide plate) capable of being movably coupled to each other in a fitted-together manner at least in part. For example, the second housing or the slide plate may be coupled to support at least part of the flexible display (or extendable display) and to operate in a sliding manner at least in part from the first housing. Since the electronic device is manually extendible or contractible by a motion between the first housing and the second housing, or automatically or semi-automatically transitions to an extended or reduced state through an internal driving mechanism, a planar area of the display region which is exposed to the outside of the display may be variable.

A portable electronic device adopts a display or display region having a large area (e.g., planar area) compared to a housing to provide a wide screen. Since a large display results in an increase in an overall size of the electronic device, a size of the display is limited. Accordingly, a portable device adopting an extendable display has emerged. For example, the display of the electronic device may be folded or selectively drawn in part into the electronic device. The portable device may not only provide excellent portability by reducing the overall size of the display when carried, but also provide a wide screen by extending a width of the screen displayed when watching a video.

A typical method in which the electronic device adopts a display selectively drawn into the housing includes, for example, a method of winding the display about a roller with the roller being in the center, or a method of turning a proceeding direction of the display by 180 degrees so that the display is drawn into the housing by being folded with respect to one shaft close to an edge of the housing.

SUMMARY

When the electronic device includes the display which is extended or reduced by changing the proceeding direction of the display by 180 degrees according to a motion of the housing, an antenna for wireless charging of the electronic device or near field communication (NFC) may overlap with at least part of the display, which may result in deterioration of antenna performance. In addition, a space and location for mounting a main camera may also be limited. Further, it may be difficult to mount additional components within a range in which the display is movable in upper and lower portions of the housing, and there is difficulty in designing a structure capable of supporting a rear face of the housing of the electronic device, thereby being vulnerable to external loads.

When the electronic device includes a display which is wound around one shaft, an overall thickness of the electronic device may increase in proportion to the number of times of winding the display around the shaft. It may be difficult in practice to mount a structure (e.g., a multi-link structure) capable of supporting the display. Flatness of the display may deteriorate, and the display may be damaged.

A portable electronic device according to various embodiments may include a housing having a first width in a first direction, a flexible display slidably coupled to the housing and comprising a first portion exposed outside the housing, and a second portion extending from the first portion and drawn into or drawn out of the housing as the first portion slides against the housing, a first roller disposed inside the housing and about a first shaft adjacent to an end portion of the housing in the first direction of the housing, and a second roller disposed inside the housing and about a second shaft spaced apart from the first shaft in a second direction which is opposite to the first direction. The second portion of the flexible display may be bent with a curvature radius in accordance with a radius of the first roller and is guided to be drawn into the housing. Part of the second portion drawn into the housing may be disposed to be guided to the second roller.

An electronic device according to various embodiments of the disclosure may provide a structure capable of including a display selectively drawn into the electronic device without having to increase a thickness of the electronic device.

An electronic device according to various embodiments of the disclosure may provide a guide structure capable of efficiently mounting a display inside the electronic device. Accordingly, even if the display is drawn in part into the electronic device, a wireless charging function or a near field communication (NFC) function may maintain performance thereof.

An electronic device according to various embodiments of the disclosure may provide a structure which guides a display not to damage a display drawn into the electronic device.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1A:
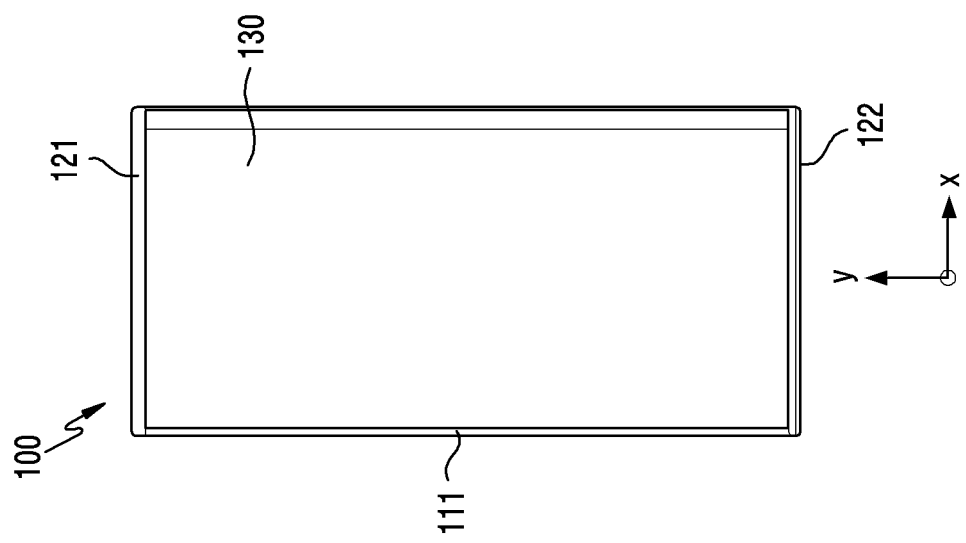
FIGS. 1A, 1B and 1C illustrate an electronic device in a state where a display region of a display is reduced in an embodiment.
Figure 1B:
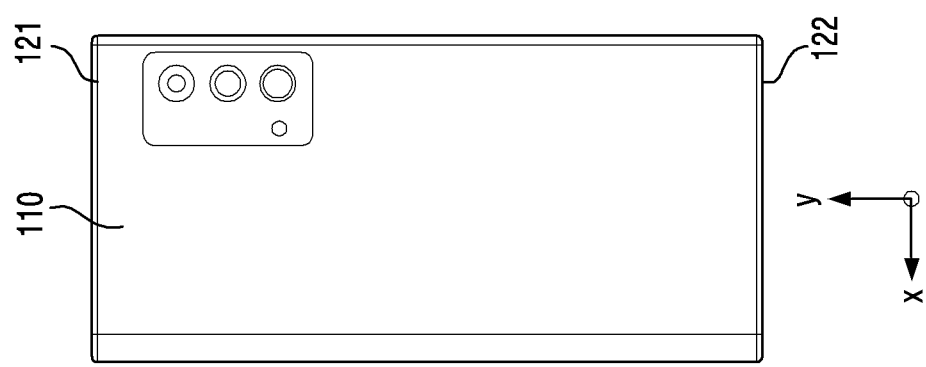
Figure 1C:
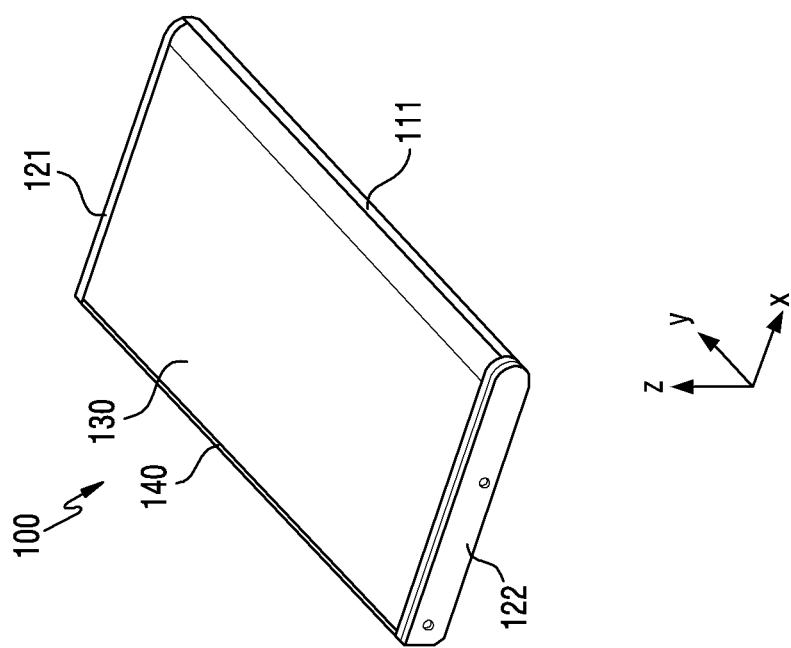
Figure 2A:
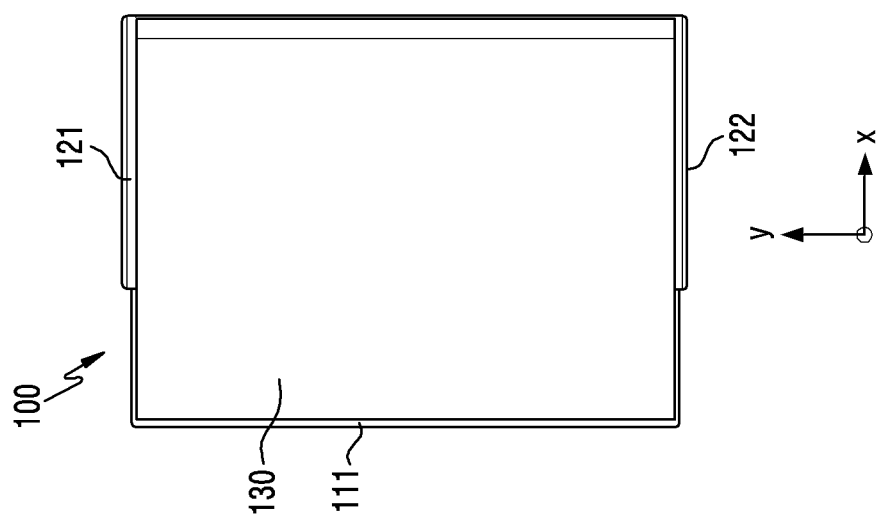
FIGS. 2A, 2B and 2C illustrate an electronic device in a state where a display region of a display is extended in an embodiment.
Figure 2B:
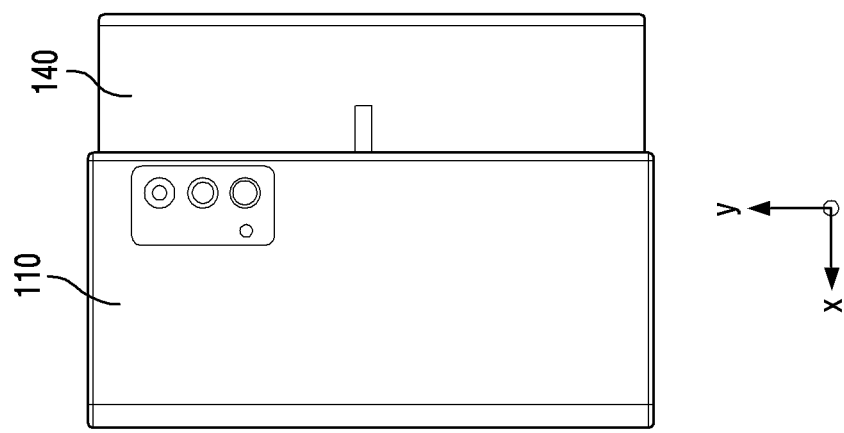
Figure 2C:
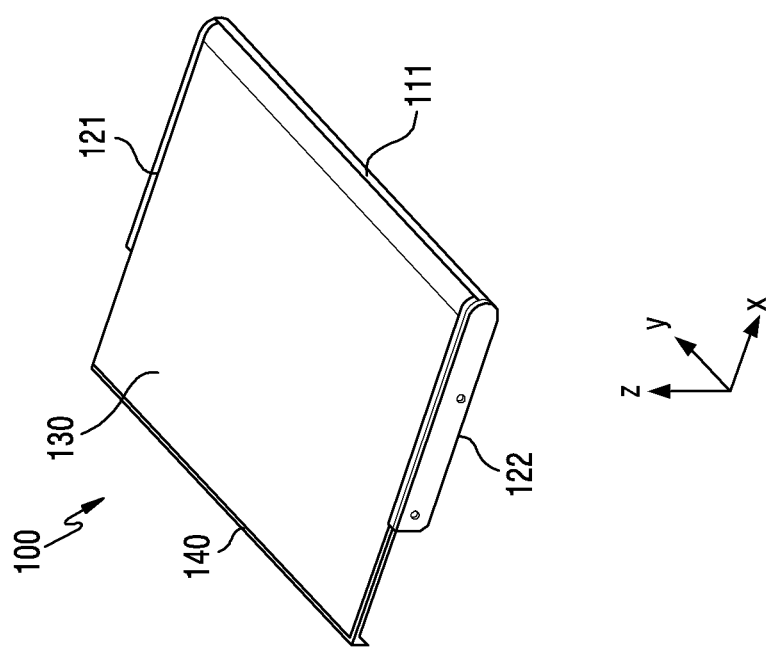

FIGS. 1A, 1B and 1C together illustrate an electronic device 100 according to an embodiment in a state where a display 130 is drawn at least in part into a housing of the electronic device 100 to reduce a display region. FIGS. 2A, 2B and 2C together illustrate the electronic device 100 according to an embodiment in a state where the display 130 is drawn at least in part out from the inside of the housing of the electronic device 100 to extend the display region. FIGS. 1A and 2A may be a front view, FIGS. 1B and 2B, may be a rear view, and FIGS. 1C and 2C may be perspective views, of the electronic device 100. Herein, one or more of FIGS. 1A to 1C may be referred to as FIG. 1, and one or more of FIGS. 2A to 2C may be referred to as FIG. 2.

Figure 3:
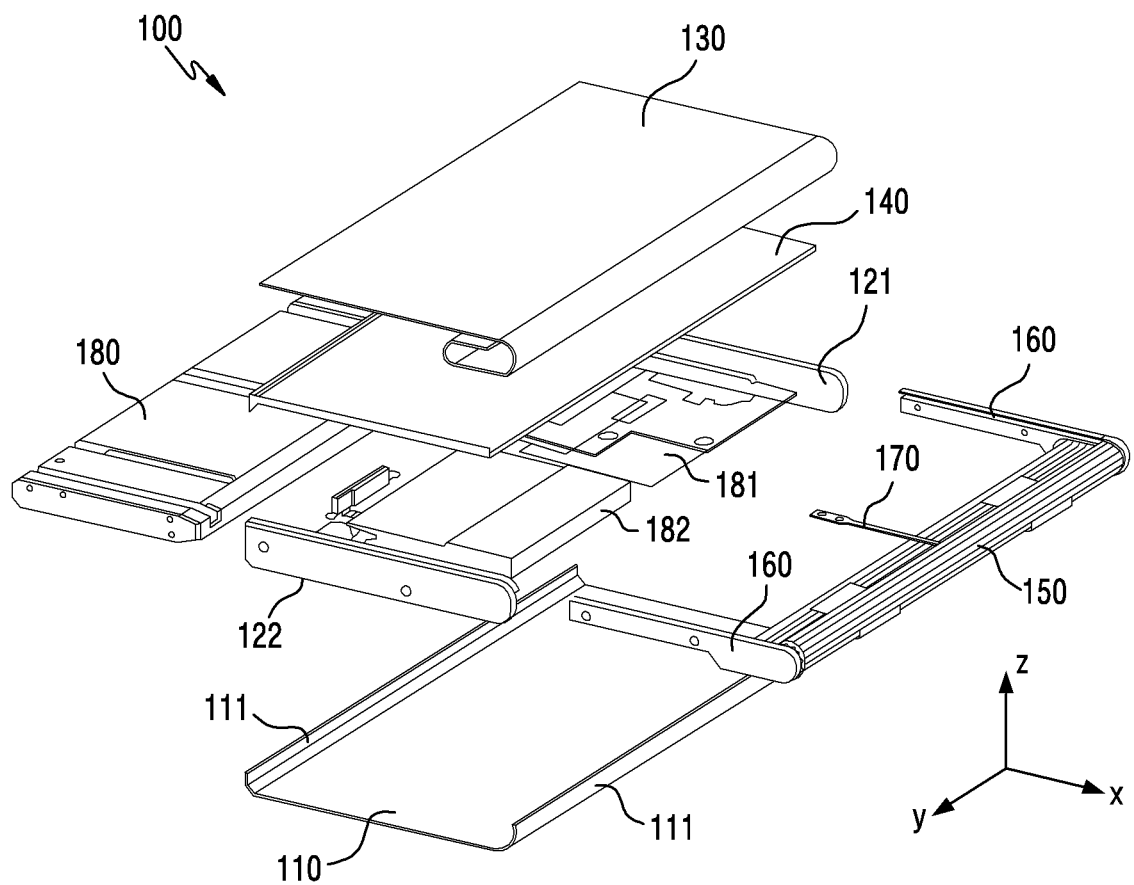
FIG. 3 is an exploded perspective view of an electronic device according to an embodiment.

FIG. 3 is an exploded perspective view of the electronic device 100 according to an embodiment.

In an embodiment, the electronic device 100 may include a housing including a rear plate 110 and side covers 121 and 122. The rear plate 110 may construct a rear face (a −z directional face) of the electronic device 100. The side covers 121 and 122 may construct part of a side face of the electronic device 100. In an embodiment, the rear plate 110 may further include an extension portion 111 which extends towards a front face (a +z directional face) of the electronic device 100. The extension portion 111 may construct part of the side face of the electronic device 100. Each of the side covers 121 and 122 and the extension portion 111 may construct at least part of a side face constructed in different directions (an x-axis direction and a y-axis direction). Electronic components may be disposed to a space defined by the side covers 121 and 122 together with the rear plate 110. For example, a battery 182 or a printed circuit board 181 may be disposed to the space.

In an embodiment, the electronic device 100 may include a flexible display 130 movably coupled to the housing. In an embodiment, the flexible display 130 (herein also referred to as a display 130) may include a portion always visually exposed to the outside and a portion selectively exposed to the outside. The display 130 may be drawn at least in part into the electronic device 100 so as not to be exposed to the outside (e.g., the outside of the electronic device 100), and a corresponding portion may be drawn out of the electronic device 100 so as to be exposed to the outside.

In various embodiments of the disclosure, when it is said that the display 130 is in an extended state, it may mean a state where a display region of the display 130 is drawn out of the electronic device 100 to the maximum extent possible so that a portion exposed to the outside has a maximum size or area (e.g., a maximum planar size or planar area). In addition, when it is said that the display 130 is in a reduced state, it may mean a state where the display region of the display 130 is drawn into the electronic device 100 to the maximum extent possible so that a portion exposed to the outside has a minimum size or area.

The exposed portion of the display region may be disposed in a plane defined by two directions crossing each other, such as a direction along the x-axis direction and a direction along the y-axis direction, without being limited thereto. A thickness of the electronic device 100 and various components or layers thereof, may be defined along a direction crossing the plane, such as a direction which is normal to the plane, to define a thickness direction.

Figure 4A:
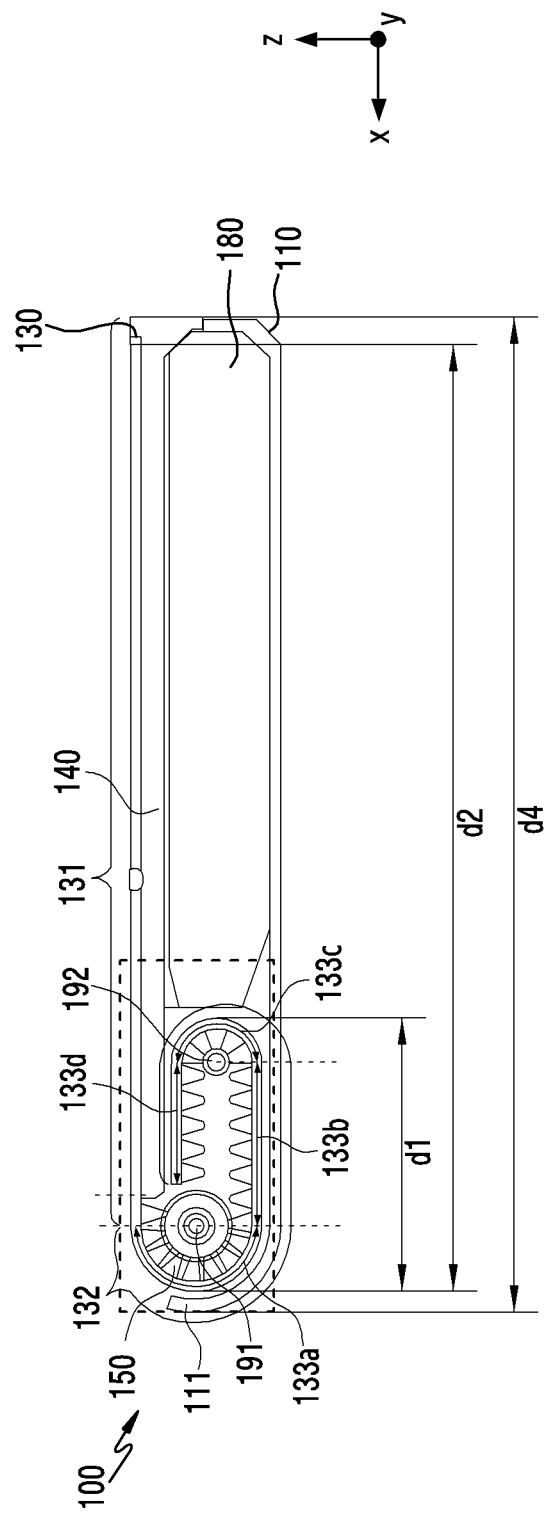
FIGS. 4A and 4B are cross-sectional views of an electronic device in a reduced state in an embodiment.
Figure 4B:
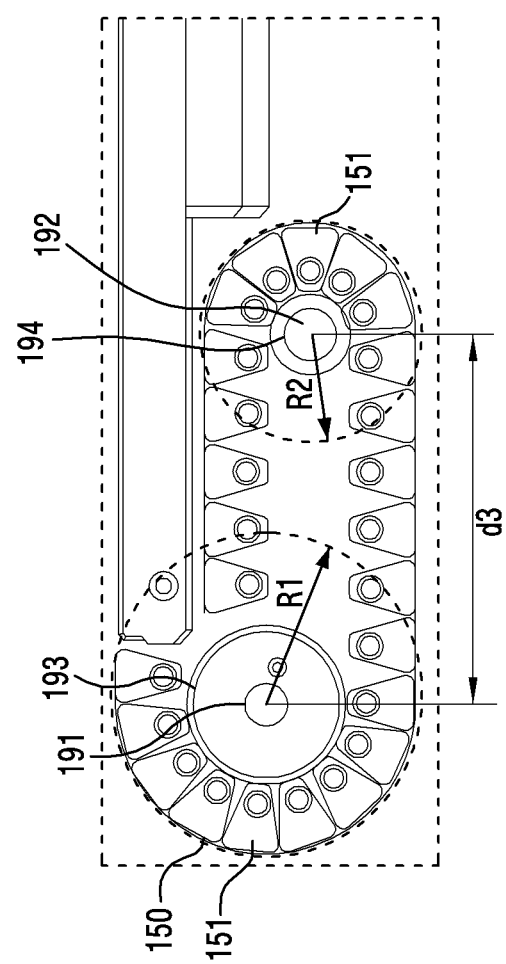
Figure 4C:
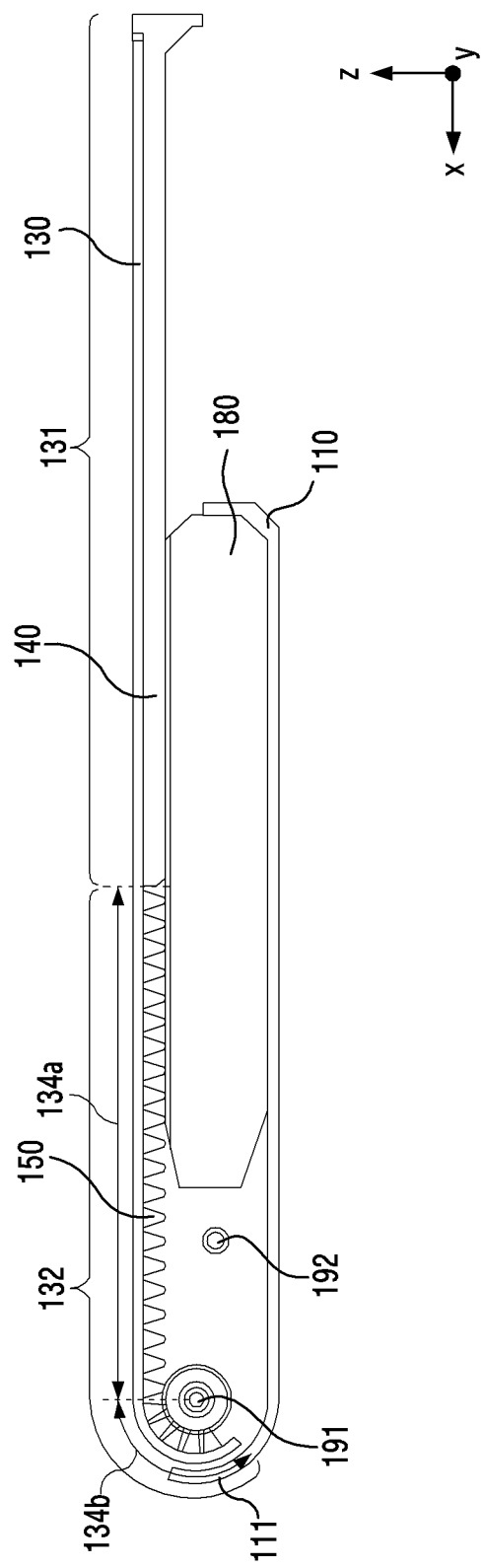
FIG. 4C is a cross-sectional view of an electronic device in an extended state in an embodiment.

Referring to FIGS. 4A, 4B or FIG. 4C, in an embodiment, the flexible display 130 may include a planar portion 131 (or a first portion) and a bending portion 132 (or a second portion) which extends from an edge of the planar portion 131. The bending portion 132 may be bendable about a bending axis. The planar portion 131 is a planar area of the flexible display 130 which is always exposed to the front face of the electronic device 100, and may be configured to be slidable against the housing. The bending portion 132 may be a planar area of the flexible display 130 which is exposed to the outside selectively depending of a slide of the planar portion 131. For example, in the bending portion 132, a portion exposed to the front face of the electronic device 100 which is expanded, may be hidden within an interior of the electronic device 100 by being drawn into the electronic device 100 which is contracted since the planar portion 131 slides against the housing in a first direction (a +x direction as a retraction direction). In the bending portion 132, a portion hidden inside the electronic device 100 which is contracted may be drawn out of the electronic device 100 so as to be exposed to the front face of the electronic device 100 which is expanded when the planar portion 131 slides against the housing in a second direction (a −x direction as an expansion direction).

In an embodiment, the planar portion 131 may be coupled to a slide plate 140, and the slide plate 140 may be configured to be slidable against the housing. The slide plate 140 may be slidably coupled to a support member 180 disposed inside the housing.

In an embodiment, the electronic device 100 may include a multi-link hinge 150 configured to support the bending portion 132 of the display 130 and along which the bending portion 132 is slidable. The multi-link hinge 150 is attached to a rear face of the bending portion 132, and may be transformed according to the bending of the bending portion 132.

In an embodiment, the multi-link hinge 150 may include a plurality of bars 151 extending in a height direction (a y-axis of FIG. 3) of the display 130 and defining a multi-link sliding member. The plurality of bars 151 may be attached to the rear face of the display 130 by being attached side by side. Each of a bar 151 among the plurality of bars 151 may have a major dimension (e.g., a length) along the y-axis direction, to define an extension direction along the height direction.

In an embodiment, the electronic device 100 may include at least one guide structure (e.g., a first guide structure 160 and/or a second guide structure 170) which guides the multi-link hinge 150. The guide structure may determine a movement path of the display 130 attached to the multi-link hinge 150, by guiding a motion of the multi-link hinge 150. That is, the display 130 may move together with the multi-link hinge 150.

In an embodiment, the electronic device 100 may include the first guide structure 160 configured to guide the multi-link hinge 150 by accommodating part of both of opposing ends of the multi-link hinge 150. For example, the first guide structure 160 may include a guide plate 161, and the guide plate 161 may include a guide groove 162 capable of accommodating a length portion of the plurality of bars 151 constructing the multi-link hinge 150. For example, each of the bars 151 may include protrusions 251 extending in a lengthwise direction at both ends, and the protrusion 251 may be accommodated at least in part in the guide groove 162. Since the protrusion 251 is accommodated in the guide groove 162, a movement path of the multi-link hinge 150 may be determined by a path of the guide groove 162. The multi-link hinge 150 according to an embodiment moves along the guide groove 162, thereby being able to determine a movement path of the bending portion 132 of the display 130.

The electronic device 100 according to an embodiment may further include the second guide structure 170 disposed at the center of the multi-link hinge 150 which is defined along a length of the multi-link hinge 150. In an embodiment, the second guide structure 170 may include a rail which guides the movement path of the multi-link hinge 150. Each of the bars 151 may include a hook which may be caught at or engaged with the guide rail. The hook moves along the guide rail, thereby being able to determine the movement path of the multi-link hinge 150 and the movement path of the display 130. In the second guide structure 170, a path of the guide rail may be configured to correspond to the path of the guide groove 162 of the first guide structure 160. That is, the path of the guide rail and the path of the guide groove 162 may be configured to match the movement path of the multi-link hinge 150 which moves along these paths.

Embodiments illustrated in FIG. 1 to FIG. 3 are merely examples, and some of components illustrated in an embodiment may be omitted. For example, the second guide structure 170 may be omitted in the electronic device 100.

According to various embodiments of the disclosure, a 'slide of the display 130' may mean a slide of the planar portion 131 (or the slide plate 140 on which the planar portion 131 is mounted) against the housing. A height (a vertical length) of the display 130 according to various embodiments of the disclosure may be defined as a length of the display 130 in a y-axis direction. In addition, a width (or a horizontal length) of the display 130 may be defined as a length of a portion of the display 130, which is exposed to the front face of the electronic device 100 in an x-axis direction. In an embodiment, a width of a display region of the display 130 may be increased or decreased according to an extension or reduction (e.g., contraction) of the display 130. The extension or reduction of the display 130 according to various embodiments of the disclosure means that a planar size of the portion of the display 130 which is exposed to outside of the housing, is extended or reduced.

The electronic device 100 illustrated in FIG. 1 and FIG. 2 includes the horizontally extendable display 130, but an embodiment of the disclosure is not limited thereto. In another embodiment, the electronic device 100 may include the display 130 which is extendable in a height direction (the y-axis direction). The sliding of the display 130 may result in an increase or decrease in the height of the display 130.

FIG. 4A, FIG. 4B and FIG. 4C illustrate a state where the display 130 of the electronic device 100 is reduced or extended in an embodiment. FIG. 4B may be an enlarged view of the dotted line portion indicated in FIG. 4A, for which the display 130 is omitted for convenience of explanation.

FIGS. 4A and 4B illustrate a state (hereinafter, a reduced state or a first state) where an exposed portion of the display 130 is reduced to the maximum extent possible in an embodiment, such as to define an electronic device 100 which is closed (e.g., in a closed state). In the first state, a width of the display 130 may be substantially the same as a width of the electronic device 100.

FIG. 4C illustrates a state (hereinafter, an extended state or a second state) where the display 130 is extended to the maximum extent possible in an embodiment, such as to define an open state. In the second state, the width of the display 130 along the x-axis direction may be greater than the width of the electronic device 100 along the x-axis direction.

When the planar portion 131 slides in the −x direction from the first state, the bending portion 132 hidden inside the electronic device 100 may be drawn at least in part out of the front face of the electronic device 100. Accordingly, a width of a display region of the display 130, which is visible from the front face of the electronic device 100 which is expanded or open, may be increased. When the planar portion 131 slides in the +x direction from the second state, the bending portion 132 may be drawn in part into the electronic device 100. Accordingly, the width of the display region of the display 130, which is visible from the front face of the electronic device 100 which is reduced or closed, may be decreased. The electronic device 100 which is between the maximally open and the maximally closed states, may define an intermediate width of the display region of the display 130.

In an embodiment, the electronic device 100 may include a first shaft 191 corresponding to a first rotation axis and a second shaft 192 corresponding to a second rotation axis which are installed in the housing. The two shafts may be spaced apart from each other in (or along) the x-axis direction by extending in a vertical lengthwise direction (the y-axis direction) of the display 130. The first shaft 191 is located close to an edge of the electronic device 100, and the second shaft 192 may be spaced apart from the first shaft 191 in the −x direction. That is, the first shaft 191 is located closer to the edge of the electronic device 100 than the second shaft 192.

In an embodiment, while the display 130 changes from the second state to the first state, at least part of the bending portion 132 may primarily turn about 180 degrees about the first shaft 191, and may secondarily turn about 180 degrees again about the second shaft 192. When turning about the first shaft 191 during a transition from the open state to the closed state, the display 130 may face the rear face of the electronic device 100, such as to be between the first shaft 191 and the rear plate 110 (FIG. 4A). When turning about the second shaft 192 during the transition from the open state to the closed state, the display 130 may face again the front face of the electronic device 100, such as to be between the second shaft 192 and the planar portion 131 (FIG. 4A).

A facing direction in which the display 130 according to various embodiments of the disclosure faces may be defined as a direction in which a display region of the display 130 faces. In a process of changing from the open state to the closed state in which at least part of the bending portion 132 turns about the first shaft 191 in an embodiment, it may be guided to be bent with a first curvature radius about the first shaft 191 and to be drawn into the housing of the electronic device 100. The bending portion 132 drawn at least in part into the housing may be substantially guided in a direction in which the second shaft 192 is disposed.

In an embodiment, in the first state for which the electronic device 100 is closed (FIG. 4A), the bending portion 132 may include a first portion 133a surrounding or extended along the first shaft 191, a second portion 133b extending from the first portion 133a and towards the second shaft 192, a third portion 133c extending from the second portion 133b and surrounding (or extended along) the second shaft 192, and a fourth portion 133d extending from the third portion 133c and towards the first shaft 191. The fourth portion 133d may define a distal end of the display 130. In the closed states, the first portion 133a and the third portion 133c may be curved to have a curved face, and the second portion 133b and the fourth portion 133d may be planar to have a substantially flat face.

In an embodiment, while the display 130 changes from the first state to the second state for which the electronic device 100 is opened, a portion surrounding the first shaft 191 and the second shaft 192 in the closed state, may be drawn out of the front face of the electronic device 100. The first portion 133a may move towards the first shaft 191 and turn 180 degrees along an outer surface of the first shaft 191, thereby being drawn out of the front face of the electronic device 100. The third portion 133c may move in a clockwise direction along the second shaft 192, move in a direction of the first shaft 191 and turn along the first shaft 191, thereby being drawn out of the front face of the electronic device 100. The fourth portion 133d may move towards the second shaft 192, turn 180 degrees along the second shaft 192, move towards the first shaft 191, and turn along the first shaft 191, thereby being drawn out of the front face of the electronic device 100. In the second state, the fourth portion 133d may not completely turn 180 degrees along the first shaft 191, and part of the fourth portion 133d may still surround a vicinity of the first shaft 191. That is, a portion of the bending portion 132 except for the fourth portion 133d at a distal end of the display 130, may be exposed to outside the electronic device 100 to define an exposed portion of the display 130 as a display screen or a display region of the electronic device 100.

In an embodiment, in the second state, a first region 134a of the bending portion 132 may be exposed to the front face of the electronic device 100 so as to be substantially co-planar with the planar portion 131. In an embodiment, the first region 134a of the bending portion 132 may include the first portion 133a, the second portion 133b, and the third portion 133c within the electronic device 100 which is closed. However, a configuration of the first region 134a of the bending portion 132 is not limited thereto. The second region 134b of the bending portion 132 may construct a curved face in a state of surrounding the first shaft 191. The second region 134b of the bending portion 132 may include part of the fourth portion 133d. However, a configuration of the second region 134b of the bending portion 132 is not limited thereto.

In an embodiment, the display 130 may be bent with different curvatures at each of the first shaft 191 and the second shaft 192. Referring to FIG. 4B, at least part of the display 130 may be bent about the first shaft 191 with a first curvature radius R1 (e.g., a first radius of curvature) and about the second shaft 192 with a second curvature radius R2 (e.g., a second radius of curvature) smaller than the first curvature radius R1. For example, in the first state, a curvature radius of the first portion 133a which is extended along the first shaft 191 may be greater than a curvature radius of the third portion 133c which is extended along the second shaft 192. Since a curved shape of the multi-link hinge 150 which is formed along the second shaft 192 has a smaller radius than the multi-link hinge 150 which is formed along the first shaft 191, when the electronic device 100 is in a reduced (first) state (FIG. 4A), a portion (e.g., the fourth portion 133d) traveling along the second shaft 192 may be disposed between the planar portion 131 and the second portion 133b along the z-axis direction and between the first portion 133a and the third portion 133c along an x-axis direction.

In an embodiment, the electronic device 100 may include a first roller 193 rotating (or rotatable) about the first shaft 191, and a second roller 194 rotating about the second shaft 192. In an embodiment, the first roller 193 and the first shaft 191 may be integrally constructed. The second roller 194 and the second shaft 192 may also be integrally constructed. The first curvature radius R1 and the second curvature radius R2 may be constructed or defined by respectively by a first radius of the first roller 193 and a second radius of the second roller 194. For example, the second radius of the second roller 194 may be constructed to be smaller than the first radius of the first roller 193. A region or component of the electronic device 100 which is bent with the first curvature radius R1 of the display 130 may be guided to be drawn into the electronic device 100. The display 130, which is drawn into the electronic device 100, may be guided in part to the second roller 194.

In an embodiment, when the multi-link hinge 150 moves by being bent with respect to the first shaft 191 and the second shaft 192, the multi-link hinge 150 may be in contact in part with an outer circumferential face of the first roller 193 and/or the second roller 194. Therefore, a curvature radius of the bending portion 132 of the display 130 which is mounted on the multi-link hinge 150 may correspond to outer circumferential radii of the first roller 193 and the second roller 194.

According to an illustrated embodiment, referring to FIGS. 4A and 4C, the rear plate 110 may include or define the extension portion 111 extending towards the front face. A gap may exist between the extension portion 111 and the first roller 193. The display 130 and the multi-link hinge 150 which is attached to the display 130 may be drawn into the electronic device 100 through the gap, or may be drawn out of the electronic device 100 via the gap.

In an embodiment, the extension portion 111 may be configured to cover only part of the first portion 133a of the bending portion 132. Accordingly, part of a portion of the bending portion 132 which is exposed to outside the extension portion at the first shaft 191 may construct part of the front face of the electronic device 100 and/or side face of the electronic device 100. For example, when the electronic device 100 is viewed in the +x direction, part of the bending portion 132 surrounding the first shaft 191 may be visible. Such exposed portion of the first portion 133a may define a portion of a display screen or display region of the electronic device 100.

Referring to FIG. 4A, when the display 130 is in a reduced state, a width d1 of the display 130 facing or closest to the rear face of the electronic device 100 may be smaller than a width d2 of the display 130 exposed at the front face of the electronic device 100 to outside the housing. For example, the width d1 of the display 130 facing the rear face of the electronic device 100 in the reduced state may be smaller than half of the width d2 of the display 130 exposed on the front face of the electronic device 100.

Referring to 4B as enlarged portion of FIG. 4A, an interval d3 between the first shaft 191 and the second shaft 192 may be smaller than the width d2 of the display 130 exposed to the front face of the electronic device 100. For example, the interval d3 between the first shaft 191 and the second shaft 192 may be smaller than half of the width d2 of the display 130 exposed to the front face of the electronic device 100. As another example, the interval d3 between the first shaft 191 and the second shaft 192 may be smaller than half of a width d4 of the electronic device 100, where width d4 indicates a maximum (or overall) width of the electronic device 100.

Accordingly, when the display 130 is drawn in part into the electronic device 100, a widthwise length of a space occupied by the drawn-in part inside electronic device 100 may be reduced. Since a space occupied by the display 130 is reduced in the housing, a wireless charging coil, an NFC coil, or the like may be disposed to the space without being obstructed by the display 130. The support member 180 supports substantial portions of the rear plate 110 of the electronic device 100, which may prevent or reduce damage to the display 130 due to a collision between the rear plate 110 and a portion (e.g., the second portion 133b) facing the rear face of the display 130.

Figure 5A:
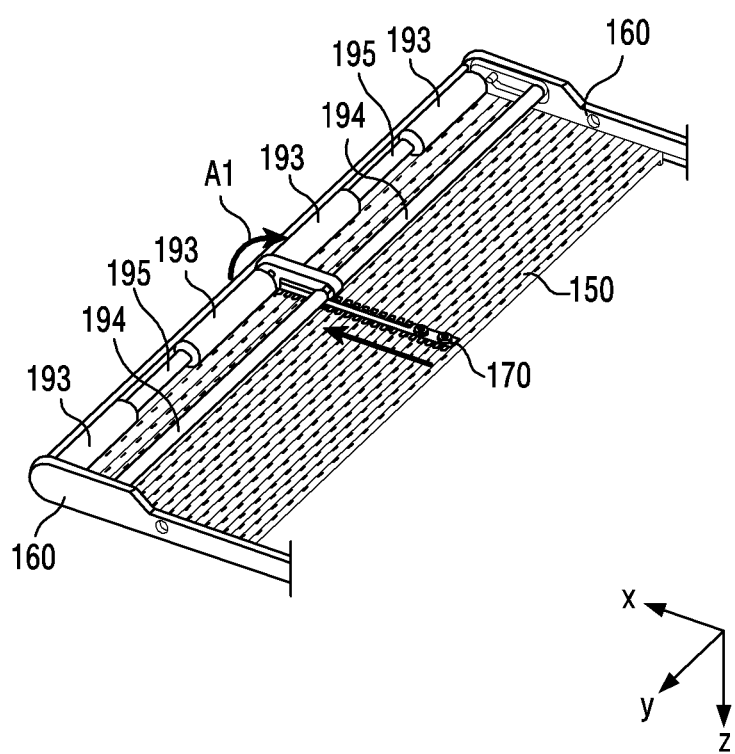
FIGS. 5A and 5B illustrate components for guiding a multi-link hinge in an embodiment.
Figure 5B:
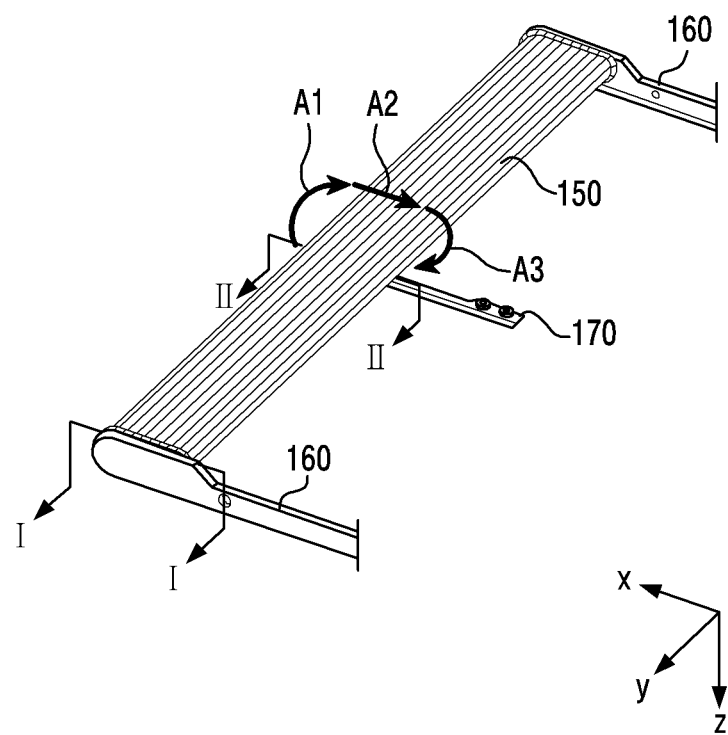
Figure 6:
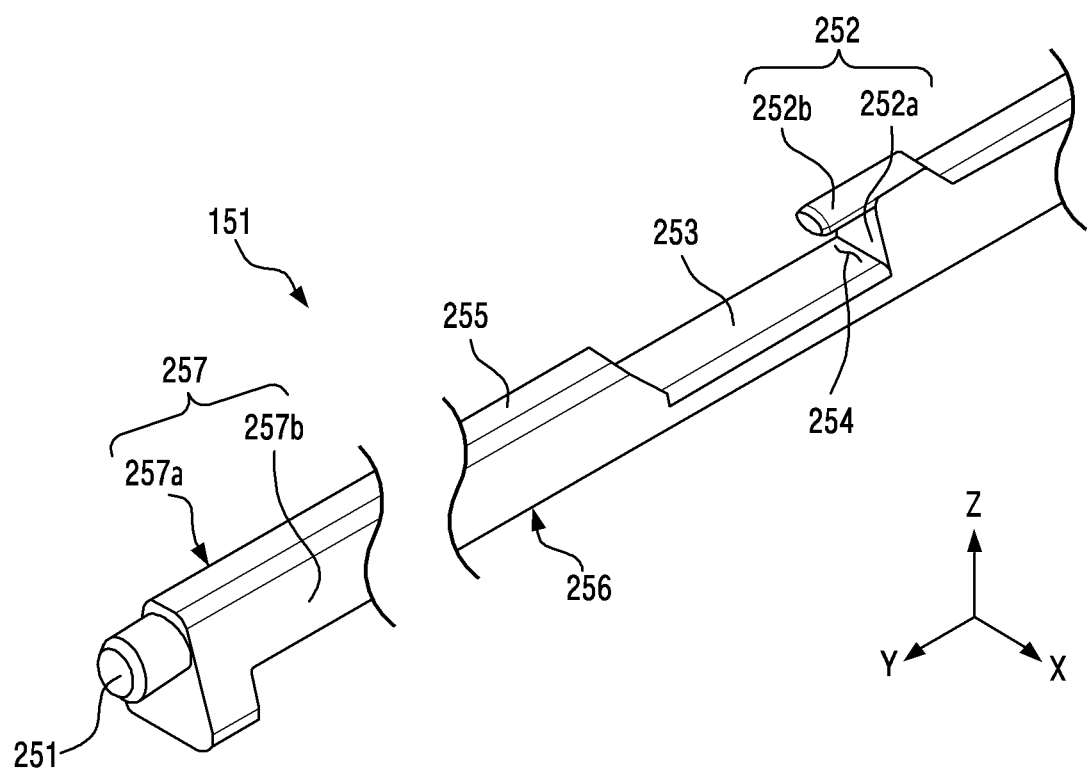
FIG. 6 illustrates a bar constructing a multi-link hinge in an embodiment.
Figure 7:
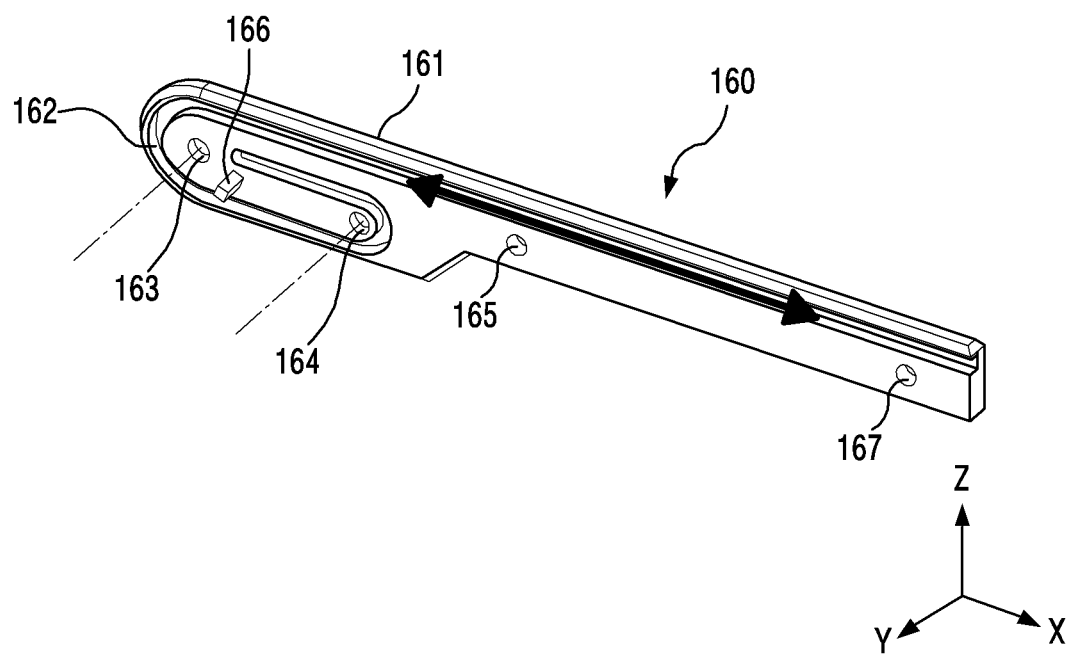
FIG. 7 illustrates a guide structure coupled to both ends of a multi-link hinge in an embodiment.
Figure 8:
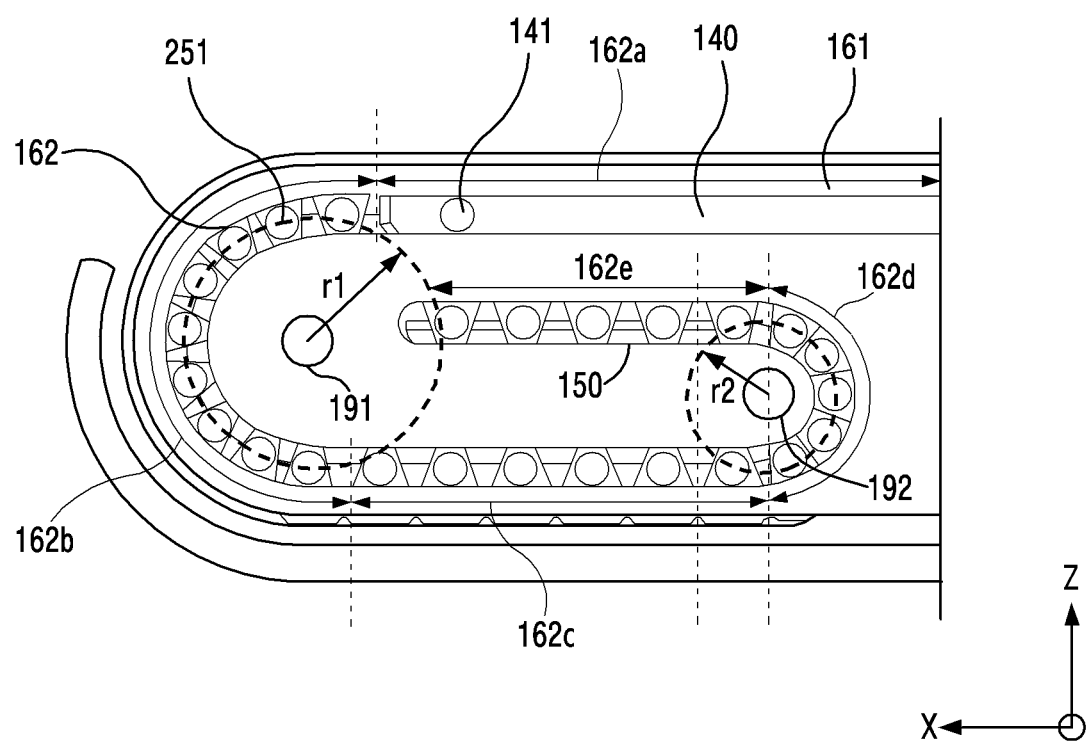
FIG. 8 is a cross-sectional view taken along line I-I of FIG. 5B in an embodiment.
Figure 9:
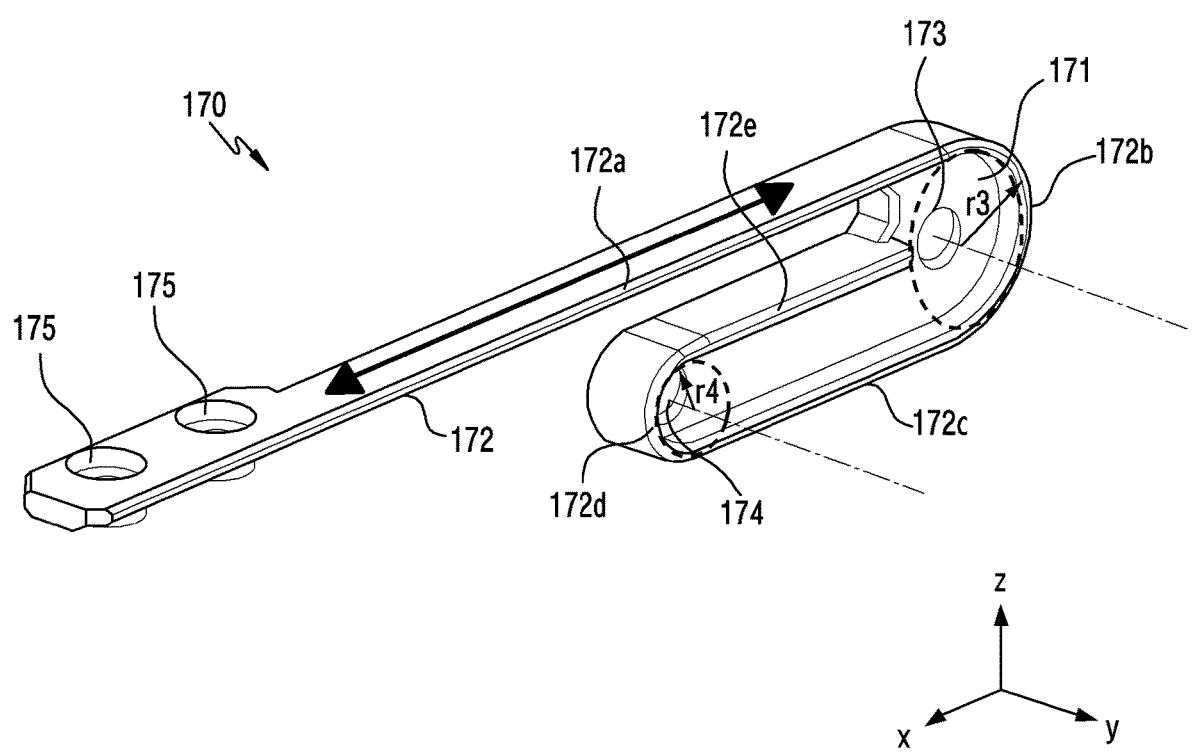
FIG. 9 illustrates a guide structure coupled to a center portion of a multi-link hinge.
Figure 10A:
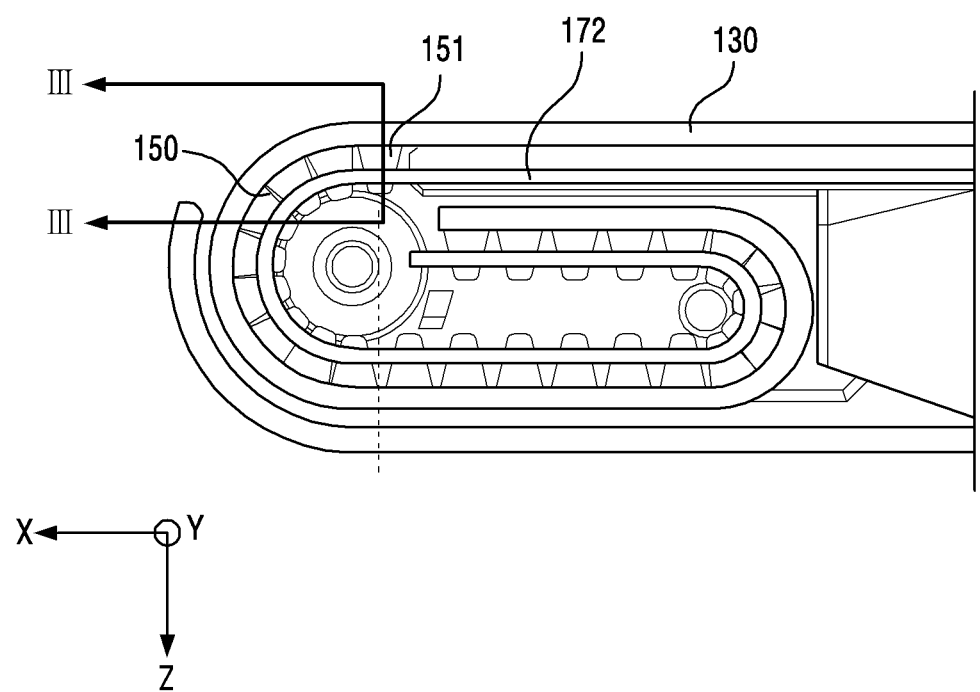
FIG. 10A is a cross-sectional view taken along line II-II of FIG. 5B in an embodiment.
Figure 10B:
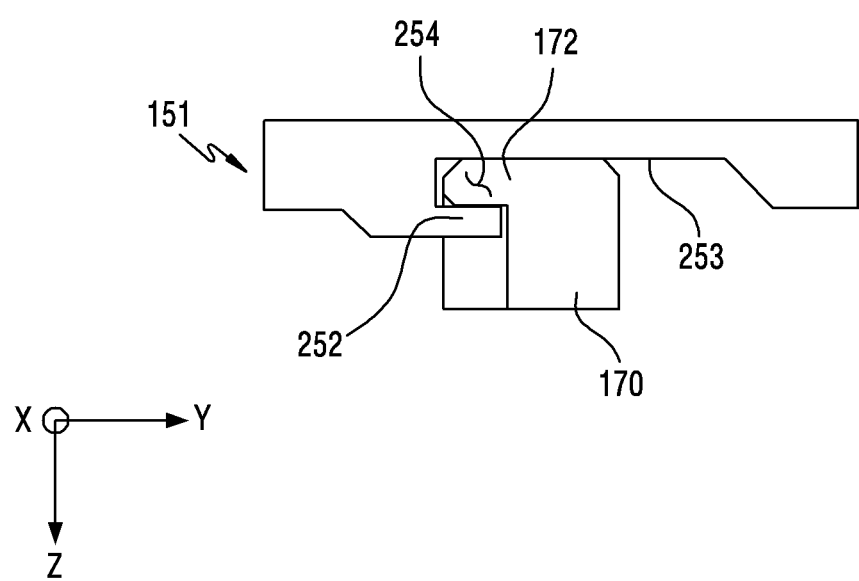
FIG. 10B is a cross-sectional view taken along line III-III in FIG. 10A.

FIGS. 5A and 5B illustrate components for guiding the multi-link hinge 150 in an embodiment, and one or more among FIGS. 5A and 5B may hereinafter referred to as FIG. 5. FIG. 6 illustrates a bar constructing the multi-link hinge 150 in an embodiment. FIG. 7 illustrates a guide structure coupled to both ends of the multi-link hinge 150 in an embodiment. FIG. 8 is a cross-sectional view taken along line I-I of FIG. 5B in an embodiment. FIG. 9 illustrates a guide structure coupled to a center portion of the multi-link hinge 150. FIG. 10A is a cross-sectional view taken along line II-II of FIG. 5B in an embodiment. FIG. 10B is a cross-sectional view taken along line III-III of FIG. 10B in an embodiment. One or more among FIGS. 10A and 10B may be hereinafter referred to as FIG. 10.

Referring to FIG. 5, the multi-link hinge 150 attached to the rear face of the bending portion 132 of the display 130 may be configured to surround at least part of an outer circumferential face of the first roller 193 and at least part of an outer circumferential face of the second roller 194 in the first state. That is, attachment of the multi-link hinge 150 to the display 130 may provide movement of the display 130 together with movement of the multi-link hinge 150 along respective rollers. When changing from the extended state to the reduced state, the multi-link hinge 150 may move in arrow directions A1, A2 and A3. The multi-link hinge 150 may sequentially move along part of an outer circumferential face of the first roller 193 (at A1), move towards the second shaft 192 (at A2), and move along part of an outer circumferential face of the second roller 194 (at A3).

In an embodiment, the electronic device 100 may include at least one guide structure configured to determine a movement path of the multi-link hinge 150. In an embodiment, the electronic device 100 may include the first guide structure 160, which interacts with the multi-link hinge 150, and the second guide structure 170.

Referring to FIG. 6, each of the bars 151 constructing the multi-link hinge 150 in an embodiment may include a roller contact face 255 (or a first face) in contact with the first roller 193 or second roller 194, a mounting face 256 (or a second face) of the display 130, on which the display 130 is mounted, and an inclined rear face 257 (or a third face) connecting the first face 255 and the second face 256 to each other. In an embodiment, the inclined rear face 257 of the specific bar 151 may be in contact with or spaced apart from an inclined rear face of a neighboring bar. In an embodiment, among a plurality of inclined faces, an inclined rear face 257a of one side (a first side) and an inclined rear face 257b of the other side (a second side opposing the first side) may be configured to form a designated angle with each other.

In an embodiment, the second face 256 is constructed to have a greater width than the first face 255. Therefore, an interval between the inclined rear faces 257a and 257b may narrow or decrease in a direction from the second face 256 to the first face 255.

In an embodiment, each of the bars 151 constructing the multi-link hinge 150 may include the protrusion 251 protruding in a lengthwise direction (e.g., a y direction) at both of the opposing ends of a bar 151. In an embodiment, the bar 151 may include a recess 253 in a center portion, which is recessed by a specific depth from a plane of the roller contact face 255, towards the mounting face 256 near the display 130. In an embodiment, the bar 151 may include a hook 252 constructed in the center portion of the bar 151. For example, the hook 252 may be implemented with a protruding part 252a extending from the recess 253 or the first face 255 in a direction (e.g., a z direction) perpendicular to a lengthwise direction of the bar 151, and an extending part 252b extending from an end portion (e.g., a distal end) of the protruding part 252a in the lengthwise direction (e.g., the y direction) of the bar 151. The multi-link hinge 150 may include a space 254 defined by a portion of the recess 253 between the surface of the bar 151 at the recess 253 together with an inner side surface of the bar 151 at the protruding part 252a and a lower surface of the bar 151 at the extending part 252b.

Referring to FIG. 7, in an embodiment, the first guide structure 160 may be configured to guide a movement path of the multi-link hinge 150. In an embodiment, the first guide structure 160 may include the guide plate 161 including the guide groove 162. The protrusion 251 located at both ends of the multi-link hinge 150 may be accommodated at least in part in the guide groove 162. In an embodiment, the first guide structure 160 may include a pair of the guide plates 161.

Referring to FIG. 5 and FIG. 7, in an embodiment, the guide plate 161 as a first guide plate may include a first hole 163 and a second hole 164 for the first shaft 191 and the second shaft 192, respectively. First ends among opposing ends of the first shaft 191 and second shaft 192 may be respectively located at the first hole 163 and the second hole 164 in the first guide plate. Second ends as the other ends among the opposing ends of the first shaft 191 and second shaft 192 may be respectively disposed to the first hole 163 and second hole 164 constructed at a second guide plate which faces the first guide plate along the y-axis direction. In an embodiment, the guide plate 161 may be fixed to the support member 180. In an embodiment, the guide plate 161 may include a third hole 165 and a fourth hole 167, and a fastening means may be prepared between the support member 180 and the third and fourth holes 165 and 167. In an embodiment, the fastening means respectively engaged with the third and fourth holes 165 and 167 of the guide plate and corresponding portions of the support member 180, may couple the guide plates 161 to the support member 180.

FIG. 8 is a cross-sectional view taken along line I-I of FIG. 5B in an embodiment. Referring to FIG. 8, the protrusions 251 constructed at both of the opposing ends of the multi-link hinge 150 may be accommodated in the plurality of guide grooves 162 of the plurality of guide plates facing each other. Since the protrusion 251 is accommodated in the guide groove 162, a movement path of the protrusion 251 may be determined by a path of the guide groove 162. According to an embodiment, the multi-link hinge 150 may move along the guide grooves 162 of the facing guide plates, and a movement path of the display 130 attached to and moveable together with the multi-link hinge 150 may be determined by the guide grooves 162.

Referring to FIG. 8, in an embodiment, the guide groove 162 may include a first straight portion 162a. When a specific portion of the multi-link hinge 150 is located at the first straight portion 162a, the display 130 disposed on the specific portion may have a substantially flat face. In an embodiment, a motion of the slide plate 140 may also be guided by the first straight portion 162a. For example, the slide plate 140 may include a protrusion 141 which may be accommodated in the guide groove 162. That is, the slide plate 140 is moveable relative to the plurality of guide plates, and may be moveable together with the multi-link hinge 150 and/or the display 130.

In an embodiment, the slide plate 140 may move along the first straight portion 162a. For example, the slide plate 140 may include the protrusion 141 accommodated at least in part in the first straight portion 162a to allow the slide plate 140 to move along the first straight portion 162a.

In an embodiment, the guide groove 162 may include a first curved portion 162b extending from an end portion of the first straight portion 162a and extended bent about the first shaft 191. When a specific portion of the multi-link hinge 150 moves along the first curved portion 162b, a direction of the display 130 disposed on the specific portion may be inflected or turned 180 degrees.

In an embodiment, the guide groove 162 may include a second straight portion 162c extending from an end portion of the first curved portion 162b towards the second shaft 192. For example, the second straight portion 162c may extend from a lower end portion of the first curved portion 162b in a −x direction. When a specific portion of the multi-link hinge 150 is located at the second straight portion 162c, the display 130 disposed on the specific portion may have a substantially flat face.

In an embodiment, the guide groove 162 may include a second curved portion 162d extending from an end portion of the second straight portion 162c and bent about the second shaft 192. When a specific portion of the multi-link hinge 150 moves along the second curved portion 162d, a direction of the display 130 disposed on the specific portion may turn 180 degrees.

In an embodiment, the second curved portion 162d may have a greater curvature than the first curved portion 162b. For example, when the first curved portion 162b has a first curvature radius r1 about the first shaft 191, the second curved portion 162d may have a second curvature radius r2 smaller than the first curvature radius r1 about the second shaft 192.

In an embodiment, the guide groove 162 may include a third straight portion 162e extending from an end portion of the second curved portion 162d towards the first shaft 191. For example, the third straight portion 162e may extend from an upper end portion of the second curved portion 162d in a +x direction. When a specific portion of the multi-link hinge 150 is located at the third straight portion 162e, the display 130 disposed on the specific portion may have a substantially flat face.

Referring to FIG. 6, in an embodiment, each of the bars 151 may include the hook 252 located at the center of the bar 151. Referring to FIG. 9, in an embodiment, the electronic device 100 may include the second guide structure 170 capable of interacting with the hook 252 located at the center of the multi-link hinge 150. The dark double-headed arrows in FIG. 7 and FIG. 9 indicate a sliding direction along the expansion direction and the contraction direction (e.g., the x-axis direction).

In an embodiment, the second guide structure 170 may include a base member 171 and a guide rail 172 which extends from the base member 171 in an x-axis direction. In an embodiment, the base member 171 may include a first through-hole 173 and a second through-hole 174. The first shaft 191 and the second shaft 192 may be located respectively at the first through-hole 173 and the second through-hole 174. In an embodiment, the second guide structure 170 may be coupled to the support member 180. For example, the base member 171 may include through-holes 175 at which the second guide structure 170 is coupled to the support member 180. In an embodiment, the second guide structure 170 is fastened to the support member 180 at the through-holes 175, and the support member 180 may include screw holes corresponding to the through-holes 175. The second guide structure 170 may be fixed to the support member 180 by means of the through-holes 175 together with a screw inserted by the screw holes of the support member 180.

In an embodiment, the hooks 252 constructed at the center of the multi-link hinge 150 may be movably coupled to the guide rail 172. Referring to FIG. 10, since the guide rail 172 is accommodated in part in the space 254 defined by the hook 252 and the recess 253, the hook 252 may be movably coupled to the guide rail 172.

In an embodiment, the guide rail 172 may include a first straight portion 172a. In an embodiment, the guide rail 172 may include a first curved portion 172b extending from an end portion of the first straight portion 172a and bent about the first shaft 191. In an embodiment, the guide rail 172 may include a second straight portion 172c extending from the end portion of the first straight portion 172a towards the second shaft 192. For example, the second straight portion 172c may extend from a lower end portion of the first curved portion 172b in the +x direction. In an embodiment, the guide rail 172 may include a second curved portion 172d extending from an end portion of the second straight portion 172c and bent about the second shaft 192. In an embodiment, the second curved portion 172d may have a greater curvature than the first curved portion 172b. For example, when the first curved portion 172b has a first curvature radius r3 about the first shaft 191, the second curved portion 172d may have a second curvature radius r4 smaller than the first curvature radius r3 about the second shaft 192. In an embodiment, the guide rail 172 may include a third straight portion 172e extending from an end portion of the second curved portion 172d towards the first shaft 191. For example, the third straight portion 172e may extend from an upper end portion of the second curved portion 172d in a −x direction.

Figure 11:
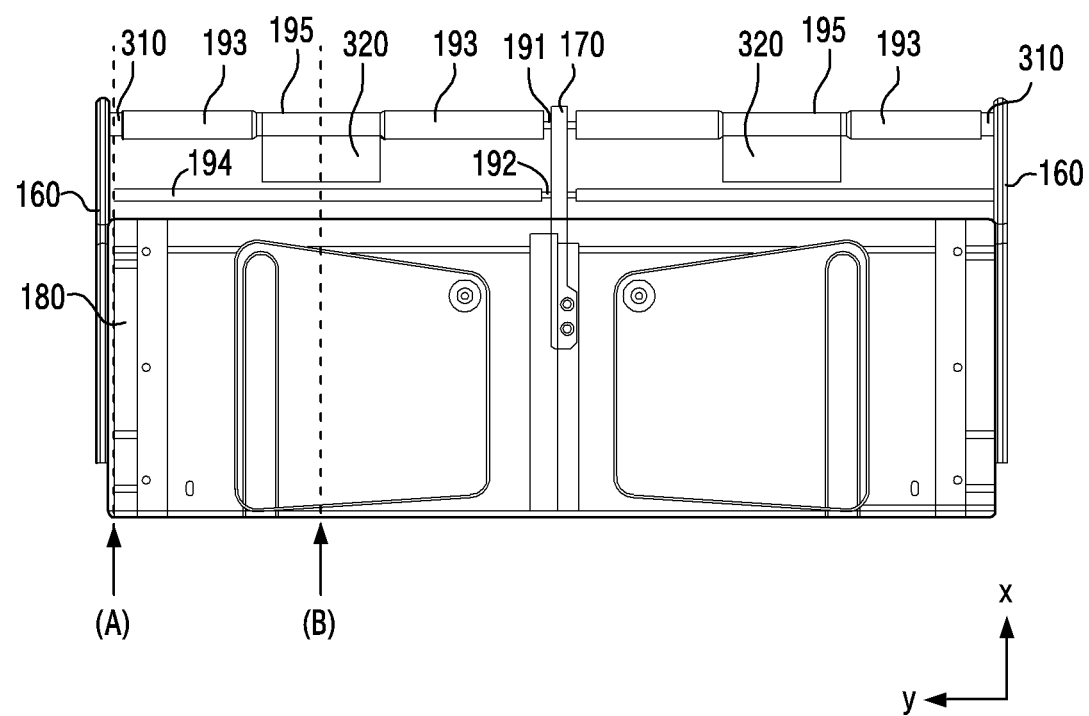
FIG. 11 illustrates a structure which provides tension to a display in an embodiment.
Figure 12:
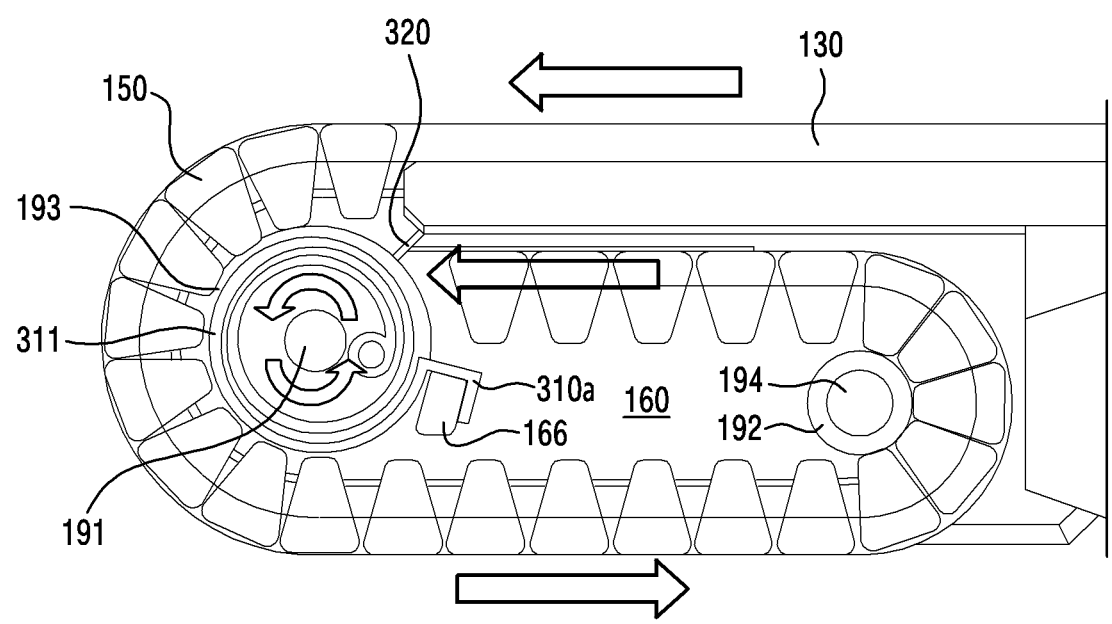
FIG. 12 is a cross-sectional view taken along line A of FIG. 11 in an embodiment.
Figure 13A:
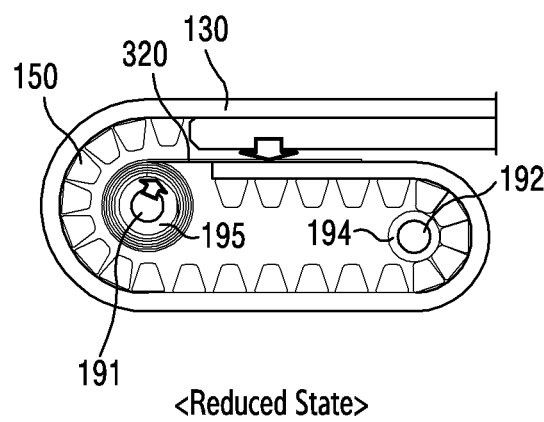
FIGS. 13A and 13B are cross-sectional views taken along line B of FIG. 11 in an embodiment.
Figure 13B:
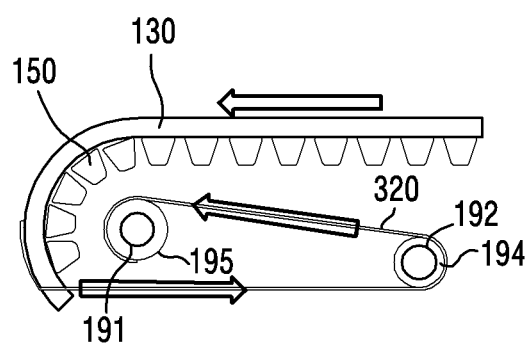
Figure 14A:
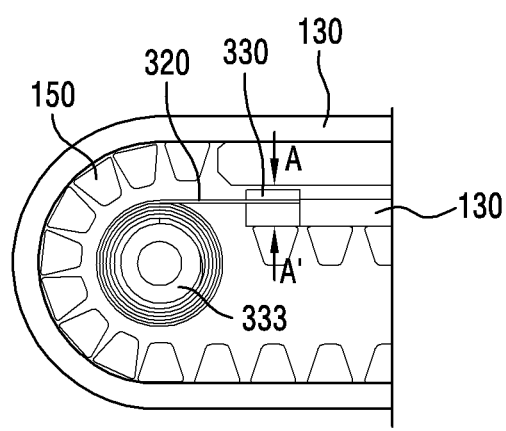
FIGS. 14A and 14B illustrate a method in which a tension band is coupled to a display in an embodiment.
Figure 14B:
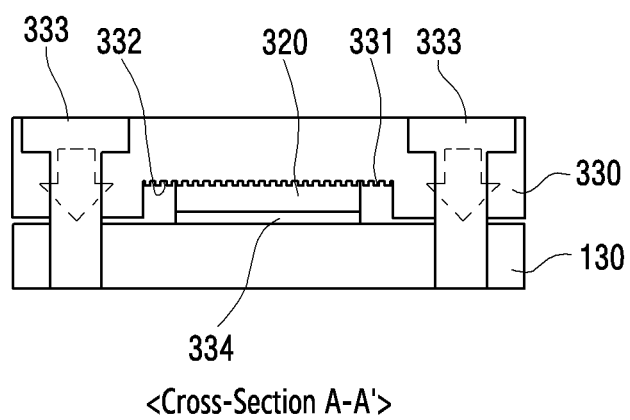

FIG. 11 illustrates a structure which provides tension to the display 130 in an embodiment. The structure illustrated in FIG. 11 may include, for example, the first guide structure 160, second guide structure 170, and support member 180 of FIG. 3. FIG. 12 is a cross-sectional view taken along line A of FIG. 11 in an embodiment. FIGS. 13A and 13B are cross-sectional views view taken along line B of FIG. 11 in an embodiment. One or more among FIGS. 13A and 13B may be hereinafter referred to as FIG. 13 FIGS. 14A and 14B illustrate a method in which a tension band 320 is coupled to the display 130 in an embodiment. One or more among FIGS. 14A and 14B may be hereinafter referred to as FIG. 14.

Referring to FIG. 11 and FIG. 12, the electronic device 100 may include an elastic member 310 which provides an elastic force to the display 130. In an embodiment, the elastic member 310 may be coupled between the first shaft 191 and the first guide structure 160. For example, the elastic member 310 may include a static load spring 311. The static load spring 311 may have a shape of a long leaf spring bent with a constant curvature. The static load spring 311 may provide a constant restoration force regardless of a displacement changed after reaching a maximum load. One end 310a of the static load spring 311 may be caught at a locking protrusion 166 of the first guide structure 160, and the other end may be coupled to the first shaft 191 or the first roller 193 coupled to the first shaft 191. The elastic member 310 may provide a torque for rotating the first shaft 191 (or the first roller 193) in a direction in which a planar portion slides in a first direction (a +x direction) so as to be drawn into the electronic device 100.

In an embodiment, the static load spring 311 may provide a torque for tensioning the display 130 to the first shaft 191 even in a state where the display 130 is reduced. For example, the static load spring 311 may be located between the first roller 193 and the first guide structure 160 in a state where a constant load has already been applied when manufactured.

Referring to FIG. 11 and FIG. 13, in an embodiment, the electronic device 100 may include the tension band 320 (or a belt) which transfers tension to the display 130. In an embodiment, the tension band may be made of a material such as a polyethylene (PET) sheet, a polyurethane (PU) sheet, or the like. One end of the tension band 320 may be coupled to the third roller 195 coupled to the first shaft 191, and the other end may be coupled to the display 130 and/or the multi-link hinge 150.

In an embodiment, the elastic member 310 may generate a torque on the first shaft 191, and the first shaft 191 may provide tension to the display 130 through the tension band 320. The static load spring 311 may provide a certain level of tension to the display 130 through the tension band 320, and the tension band 320 may pull the display 130 in a direction towards the first shaft 191 to improve flatness of the display 130.

In an embodiment, the tension band 320 may be wound around the third roller 195 coupled to the first shaft 191, and may move along the display 130 while being unfolded or unrolled when the display 130 is extended. Even if the display 130 is extended so that a terminal end of the display 130 moves, the first shaft 191 may persistently provide tension to the display 130 through the tension band 320. For example, in a state where the display 130 is extended, the tension band 320 may extend from the terminal end of the display 130 towards the second shaft 192, surround part of the second shaft 192, and extend from the second shaft 192 towards the first shaft 191. Since the third roller 195 and the display 130 are still coupled by means of the tension band 320, a counterclockwise torque acting on the third roller 195 may provide tension to the display 130, which may improve the flatness of the display 130.

In an embodiment, the third roller 195 and the first shaft 191 may be integrally constructed. The third roller 195 and the first roller 193 may be aligned along a direction crossing a sliding direction (e.g., the y-axis direction), and may have centers which coincide with each other along the y-axis direction. In an embodiment, the third roller 195 may have a smaller radius than the first roller 193. This is because interference may occur between the tension band 320 and the multi-link hinge 150 when an outer circumferential face of the tension band 320 wound around the third roller 195 has a greater radius than an outer circumferential face of the first roller 193 since the tension band 320 has a specified thickness.

Referring to FIG. 14, the tension band 320 may be more firmly coupled to the display 130 through a first member 330. Referring to the cross-section A-A' of FIG. 14A, in an embodiment, the tension band 320 may be attached to part of the display 130 through a second member 334. For example, the second member 334 may include bond or tape. In an embodiment, the first member 330 may be disposed on the tension band 320 to provide a force pressing the tension band 320 in a direction of the display 130. A center portion of the first member 330 may include a recess 331 capable of accommodating the tension band 320. In an embodiment, the first member 330 may be coupled to the display 130 through a screw 333.

In an embodiment, a surface 332 in contact with the tension band 320 of the first member 330 may be subjected to knurling processing. A knurling process may provide a relatively high frictional force between the tension band 320 and the first member 330, which may make a connection between the tension band 320 and the display 130 more secure.

Figure 15A:
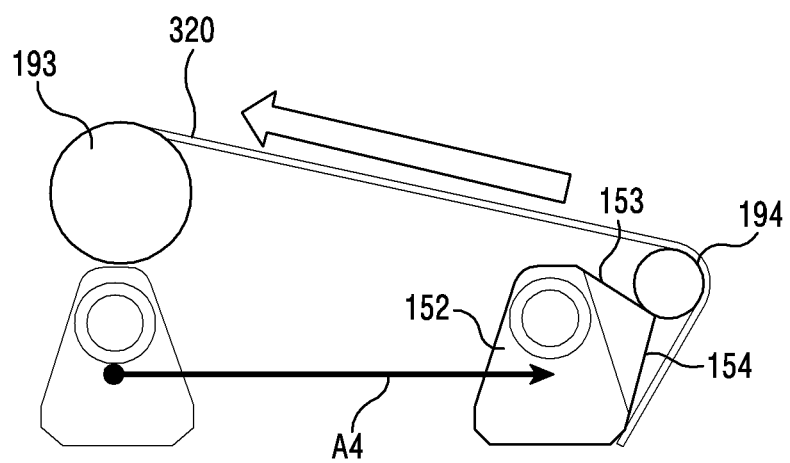
FIGS. 15A and 15B illustrate a double inclined structure included in a last bar of a multi-link hinge in an embodiment.
Figure 15B:
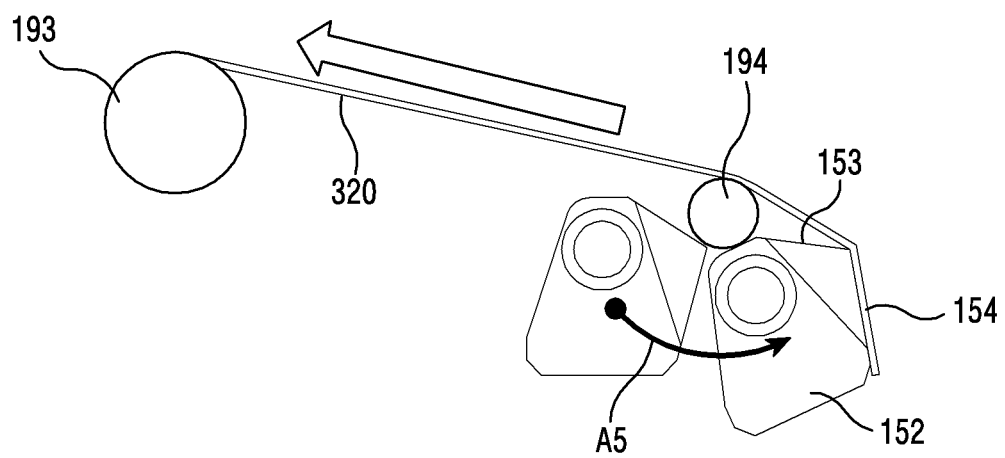

FIGS. 15A and 15B illustrate a double inclined structure included in a last bar among the plurality of bars 151 of the multi-link hinge 150 in an embodiment.

When one end of the tension band 320 is attached to the display 130, the multi-link hinge 150 disposed under the display 130 may not pass smoothly when passing the second roller 194. In an embodiment, when the multi-link hinge 150 encounters the second roller 194 coupled to the second shaft 192 according to an arrow direction A4, a bar 152 (hereinafter, a first-contact bar) which is first in contact with the second roller 194 as a leading bar may have a different shape from other bars.

In an embodiment, the first-contact bar 152 may include a first face 153 as a face facing (or closest to) the second roller 194. The first face may also be referred to as a slide face. For example, the first-contact bar 152 may have the first face 153 and second face 154 having angles different from each other at one side. When the first-contact bar 152 encounters the second roller 194, the first face 153 may be first in contact with the second roller 194, which may facilitate the first-contact bar 152 to be smoothly mounted on the second roller 194 in an arrow direction A5.

Figure 16:
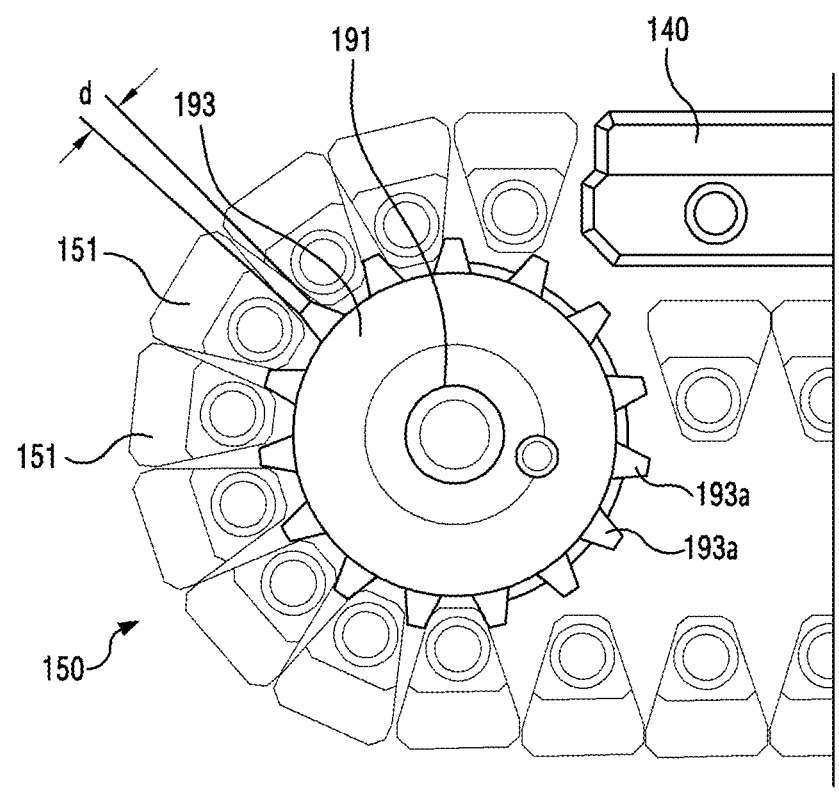
FIG. 16 illustrates a method of suppressing a backlash between bars of a multi-link hinge in a first embodiment.
Figure 17A:
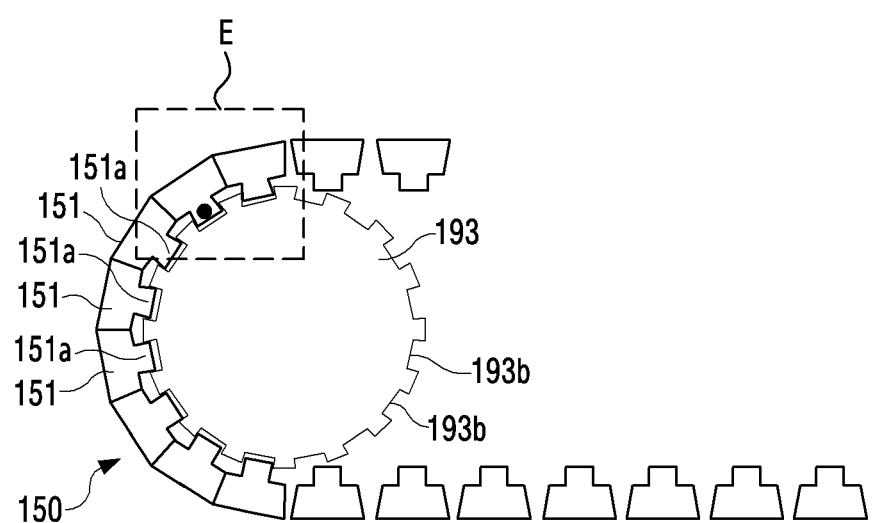
FIGS. 17A and 17B illustrate a method of suppressing a backlash between bars of a multi-link hinge in a second embodiment.
Figure 17B:
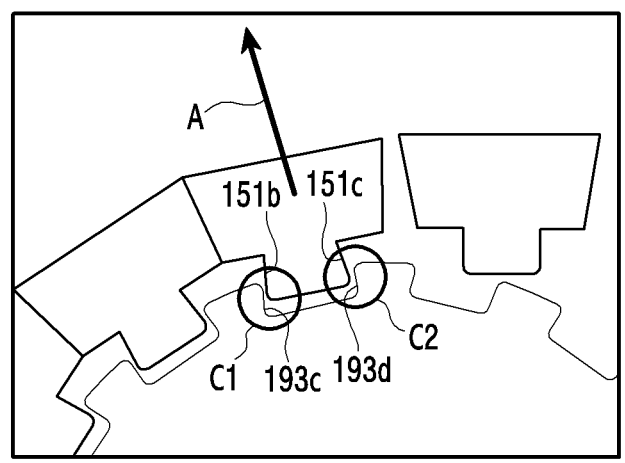

FIG. 16 illustrates a method of suppressing a backlash between the bars 151 of the multi-link hinge 150 in a first embodiment. FIGS. 17A and 17B illustrate a method of suppressing a backlash between the bars 151 of the multi-link hinge 150 in a second embodiment. FIG. 17B is an enlarged perspective view of region E of FIG. 17A. One or more among FIGS. 17A and 17B may be hereinafter referred to as FIG. 17.

Referring to FIGS. 4A 4B and 4C, an interval between the bars 151 disposed relative to an outer circumferential face of the first roller 193 may be greater than an interval between the bars 151 disposed relative to an outer circumferential face of the second roller 194. Since a radius of the first roller 193 is greater than a radius of the second roller 194, when the multi-link hinge 150 passes around the first roller 193, the interval between the bars 151 may larger than when passing around the first roller 193. Therefore, there is a need to prevent a backlash between the bars 151 passing the first roller 193. In an embodiment, the backlash between the bars 151 passing the first roller 193 may be minimized or prevented by applying an engagement structure between the roller and the multi-link hinge 150.

Referring to FIG. 16, in an embodiment, the first roller 193 may include protruding portions 193a extending in a radial direction from an outer circumferential face of the first roller 193. In an embodiment, the protruding portions 193a may be spaced apart along the outer circumferential face of the first roller 193. The protruding portions 193a of the first roller 193 may be located at the interval between adjacent bars among the bars 151 passing along the first roller 193. Since the protruding portions 193a are located between the bars 151 which are adjacent to each other, an interval d between the bars 151 may be reduced, and the backlash between the bars 151 may be suppressed.

Referring to FIG. 17, in an embodiment, the first roller 193 may include accommodating portions 193b capable of accommodating part of the bar 151. For example, the first roller 193 may include recesses 193b recessed towards the center of the outer circumferential face and open in a direction towards the multi-link hinge 150, and part of the bar 151 passing around the first roller 193 may be accommodated in the recess to be engaged with the first roller 193. In an embodiment, the recesses 193b may be disposed along the outer circumferential face of the first roller 193 with regular intervals in a circumferential direction.

In an embodiment, the bar 151 may include a protruding portion 151a configured to be accommodated in the recess 193b. While the bars 151 pass along the first roller 193, the protruding portion 151a of the bar 151 may be engaged with the recess 193b of the first roller 193 to suppress the backlash between the bars 151.

In an embodiment, the protruding portion 151a and the recess 193b may be wedge-bonded with each other. For example, the recess 193b may have inclined faces 193c and 193d which define a width therebetween between which increases in a direction towards the center of the first roller 193. The protruding portion 151a of the bar 151 may have inclined faces 151b and 151c corresponding to the inclined faces 193c and 193d of the recess 193b.

When the bar 151 of the multi-link hinge 150 first encounters the first roller 193 in a counterclockwise direction, the inclined face 151b of a side C1 of the protruding portion 151a of the bar 151 may be primarily in contact with the inclined face 193c of a side C1 of the recess 193b (e.g., a same side). When the multi-link hinge 150 further encounters the first roller 193 in a counterclockwise direction, the inclined face 151c of a side C2 of the protruding portion 151a of the bar 151 may be in contact with the inclined face 193d of the side C2 of the recess 193b. Since the protruding portion 151a and the recess 193b are subjected to the wedge bonding, when the protruding portion 151a is accommodated in the recess 193b, a motion of the protruding portion 151a may be limited in an arrow direction A of FIG. 17 in a direction away from the recess 193b. When the bar 151 turns along the outer circumference of the first roller 193 and then passes further or past the first roller 193, the protruding portion 151a and the recess 193b are separated at the side C1 as a leading side and then the protruding portion 151a and the recess 193b are separated at the side C2 as a following side. That is, owing to the curved path of the multi-link hinge 150, the bars 151 and respective roller may be disengaged from each other in order at the leading side and the following side. Since the aforementioned wedge bonding structure is applied between the protruding portion 151a and the recess 193b, the display 130 may be prevented from being lifted in an arrow direction A of FIG. 17 from the first roller 193 while passing the first roller 193, and a driving resistance between the first roller 193 and the multi-link hinge 150 may be reduced.

Figure 18A:
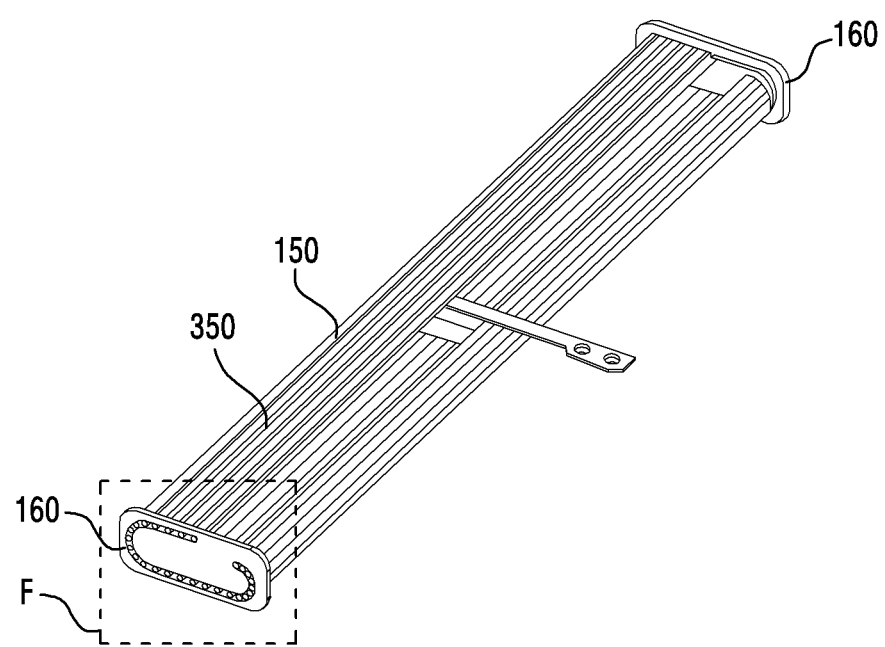
FIGS. 18A and 18B illustrate an auxiliary multi-link hinge located between a multi-link hinge in an embodiment.
Figure 18B:
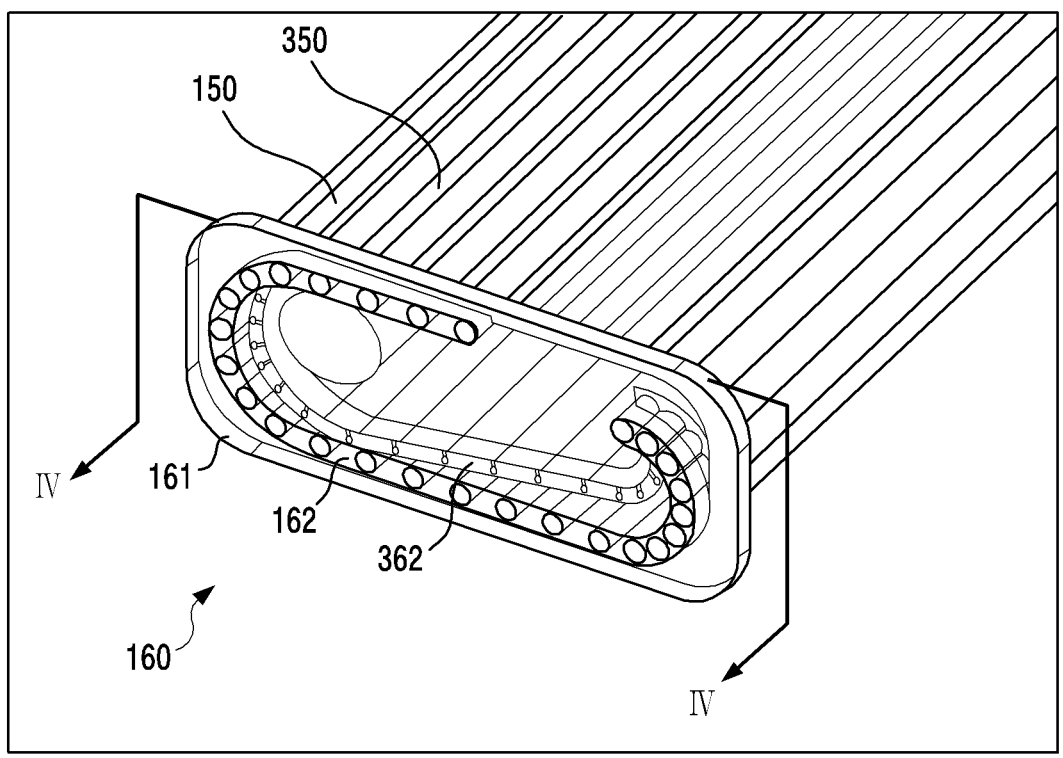
Figure 19A:
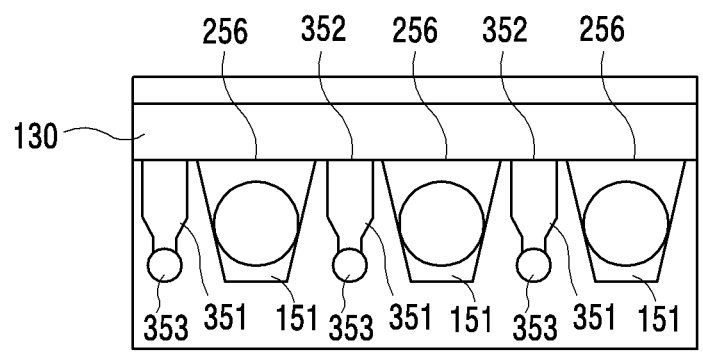
FIGS. 19A, 19B, 19C and 19D illustrate an operation of a multi-link hinge and auxiliary multi-link hinge according to a location.
Figure 19B:
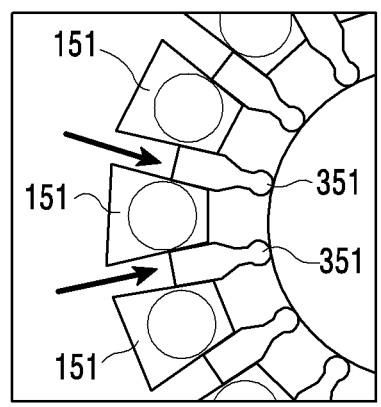
Figure 19C:
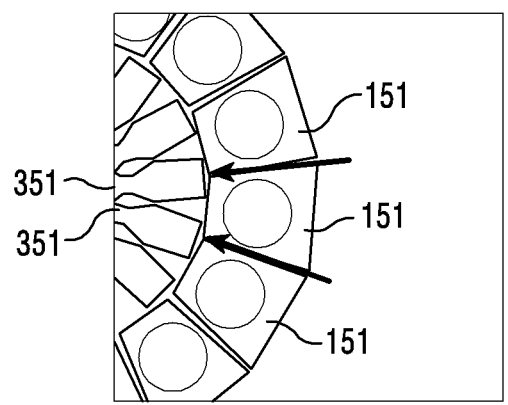

FIGS. 18A and 18B illustrate an auxiliary multi-link hinge 350 located between the multi-link hinge 150 in an embodiment. FIG. 18B is an enlarged perspective view of region F of FIG. 18A. One or more among FIGS. 18A and 18B may be hereinafter referred to as FIG. 18. FIGS. 19A, 19B, 19C and 19D illustrate an operation of the multi-link hinge 150 and auxiliary multi-link hinge 350 according to a location along a sliding path of the electronic device 100. One or more among FIGS. 19A, 19B, 19C and 19D may be hereinafter referred to as FIG. 19. FIG. 19A is a cross-sectional view taken along line IV-IV of FIG. 18B in an embodiment. FIG. 20 illustrates a cross-sectional shape of the multi-link hinge 150 in a view along the y-axis direction considering an operation of an auxiliary multi-link in an embodiment.

Referring to FIG. 18, in an embodiment, the electronic device 100 may include a double multi-link structure. In an embodiment, the double multi-link structure may be implemented with a main multi-link hinge 150 (or a first multi-link hinge 150) and an auxiliary multi-link hinge 350 (or a second multi-link hinge 350). The main multi-link hinge 150 is identical or similar to the description of FIG. 1 to FIG. 17, and redundant descriptions on the main multi-link hinge 150 will be omitted.

In an embodiment, the guide plate 161 may include the first guide groove 162 capable of guiding each of the multi-link hinges 150. The first multi-link hinge 150 may be guided by the first guide groove 162, and the second multi-link hinge 350 may be guided by a second guide groove 362. The first guide groove 162 is identical or similar to the description of FIG. 1 to FIG. 17, and redundant descriptions thereon will be omitted. The guide plate 161 may define a plurality of guide grooves including the first guide groove 162 and the second guide groove 362 which are spaced apart from each other along a plane of the guide plate 161.

In an embodiment, similarly to the first multi-link hinge 150, the second multi-link hinge 350 is constructed of a plurality of auxiliary bars 351 which may include protrusions 353 extending from both of opposing ends of the auxiliary bars 351 in a lengthwise direction (e.g., the y-axis direction). The protrusions 353 at distal ends of the second multi-link hinge 350 may be accommodated in the second guide groove 362. Accordingly, the second multi-link hinge 350 may move along the second guide groove 362.

Figure 19D:
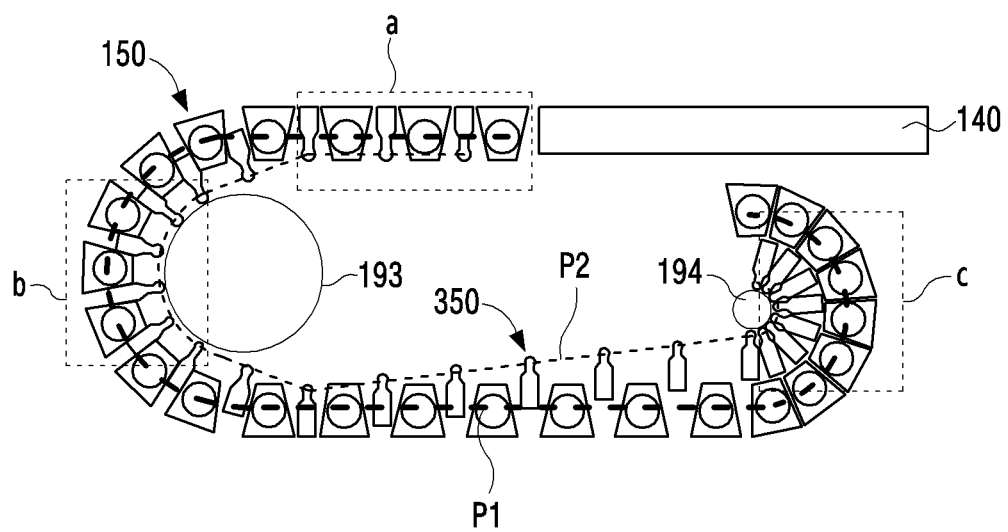
Figure 20:
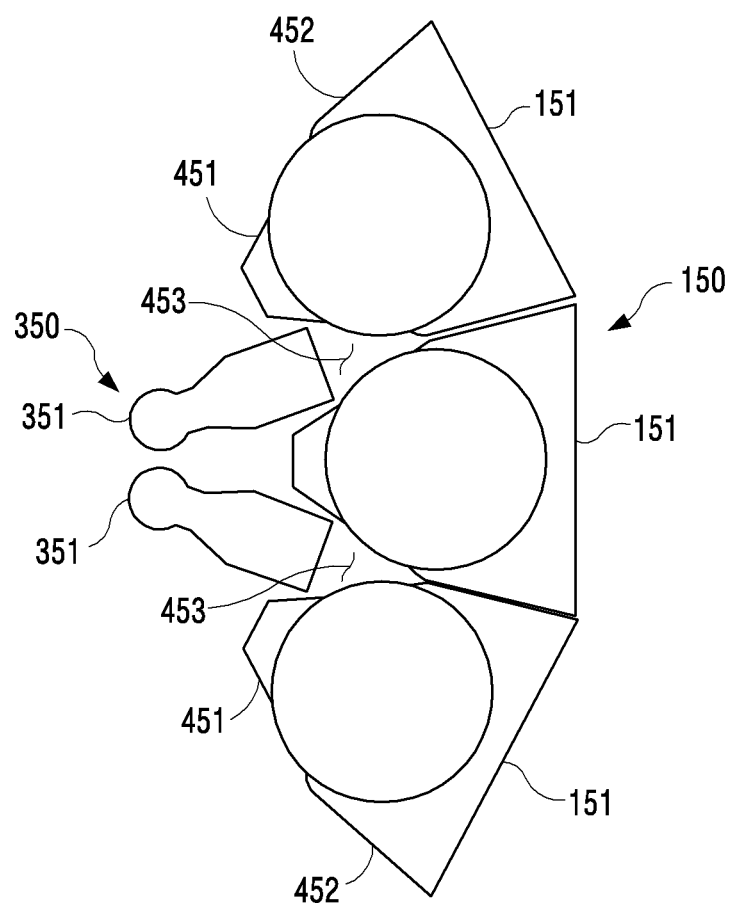
FIG. 20 illustrates a shape of a multi-link hinge considering an operation of an auxiliary multi-link in an embodiment.

Referring to FIG. 19D, a path P1 of the first guide groove 162 and a path P2 of the second guide groove 362 may be configured to be different from each other along the plane of the guide plate 161. In an embodiment, at a first location a and a second location b along the sliding path of the electronic device 100, the path P2 of the second guide groove 362 may be configured such that the auxiliary bars 351 of the second multi-link hinge 350 are located at least in part between the bars 151 of the first multi-link hinge 150.

Referring to FIG. 19D, for example, each of the bars 151 and the auxiliary bars 351 may have a height in a normal direction to the sliding path. In an embodiment, the path P1 may correspond to the sliding path such as to be parallel thereto. As being between the bars 151, a height of an auxiliary bar 351 may overlap a height of a bar 151 at one or both of opposing sides of the auxiliary bar 351 along the path P1.

In an embodiment, in a third location c, the path P2 of the second guide groove 362 may be configured such that the auxiliary bars 351 of the second multi-link hinge 350 are completely outside of a space between the bars 151 such as to escape from the bars 151 of the first multi-link hinge 150. Here, the height of the auxiliary bar 351 does not overlap the height of an adjacent bar 151 and is completely outside of the gap between two adjacent bars 151.

In an embodiment, in the first location a or first length along the sliding path, upper faces 352 of the bar 351 of the second multi-link hinge 350 may be configured to be substantially co-planar with the mounting faces 256 (refer also to FIG. 6) of the bars 151 of the first multi-link hinge 150. Accordingly, in the first location a, both the first multi-link hinge 150 and the second multi-link hinge 350 may together support the display 130 at a lower surface of the display 130 which is closest to the respective bars of the double multi-link structure. This may further improve flatness of the display 130 exposed to the front face of the electronic device 100.

In an embodiment, in the second location b or a second length along the sliding path, the auxiliary bars 351 of the second multi-link hinge 350 may further move away from the path P1 and towards the center of the first roller 193 with respect to the first multi-link hinge 150. Therefore, the upper faces 352 of the second multi-link hinge 350 may be closer to the center of the first roller 193 than the mounting faces 256 of the display 130 of the first multi-link hinge 150. A partial height portion of the auxiliary bars 351 of the second multi-link hinge 350 may be located between the bars 151 of the first multi-link hinge 150 to suppress or minimize the backlash between the bars 151 of the first multi-link hinge 150.

In an embodiment, in the third location c or a third length along the sliding path which is furthest from the display region along the sliding path, the auxiliary bars 351 of the second multi-link hinge 350 may further move towards the center of the first roller 193 with respect to the first multi-link hinge 150, and an entirety of the height of the auxiliary bars 351 of the second multi-link hinge 350 may be outside of the bars 151 of the first multi-link hinge 150. Unlike in the first location a or the second location b, the bars 151 of the first multi-link hinge 150 may be closely in contact with neighboring bars 151. That is, a width of a gap between neighboring bars 151 in a direction along the sliding direction may decrease as a position along the sliding path becomes further from the display region.

Referring to FIG. 20, the bars 151 of the first multi-link hinge 150 may be configured such that the auxiliary bars 351 of the second multi-link hinge 350 are easily received between the neighboring bars 151 of the first multi-link hinge 150. For example, even if the bars 151 of the first multi-link hinge 150 are located on an outer circumferential face of the second roller 194, the bars 151 may be configured such that a constant air gap 453 is defined between ends of the neighboring bars 151 which are closest to the roller.

In an embodiment, the bars 151 of the first multi-link hinge 150 may have a double inclined face at a same side of a bar 151. A side face of the bars 151 at a same side has both a first inclined face 451 and a second inclined face 452. While the first multi-link hinge 150 surrounds the second roller 194 (like the location c described above), the second inclined faces 452 of the bars 151 are closely in contact at an upper end closest to the display 130, but the air gap 453 may exist between the first inclined faces 451 at the lower end furthest from the display 130 (and closest to the roller). The auxiliary bar 351 of the second multi-link hinge 350 may be accommodated in part in the air gap 453 of the first multi-link hinge 150.

Referring to the views of FIG. 19 together, when the second multi-link hinge 350 changes from the second location b to the third location c, the auxiliary bars 351 of the second multi-link hinge 350 may be inserted between the bars 151 of the first multi-link hinge 150, and the structure of FIG. 20 may facilitate the operation to be reliably achieved.

Figure 21:
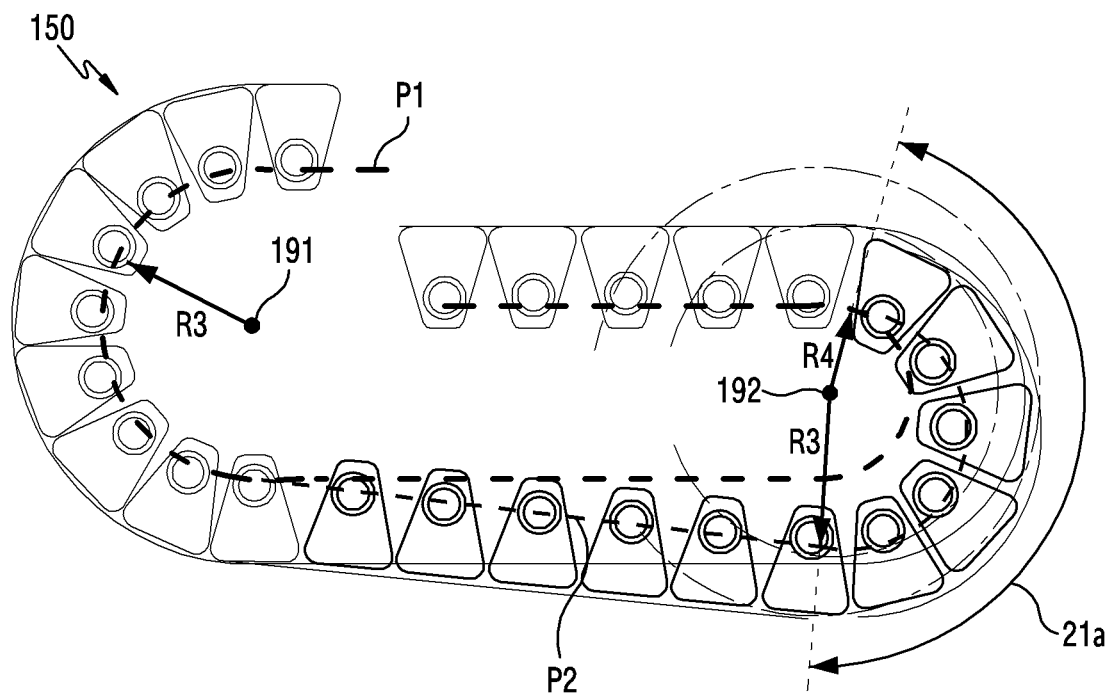
FIG. 21 illustrates a path of a multi-link hinge in an embodiment.

FIG. 21 illustrates a path of the multi-link hinge 150 in an embodiment.

In an embodiment, the display 130 may be bent with curvature radii different from each other about the first shaft 191 and/or the second shaft 192. Since a resistance force on bending of the display 130 varies depending on a curvature radius, when the display 130 surrounds both the first shaft 191 and the second shaft 192, the display 130 may be lifted in part.

In an embodiment, a path of the multi-link hinge 150 may be adjusted so that a curvature radius of a bendable portion of the display 130 is changed at positions along the sliding path. In an embodiment, when the multi-link hinge 150 follows a first path P1, the multi-link hinge 150 may be bent with a first curvature radius R3 about the first shaft 191, and may be bent with a second radius R4 about the second shaft 192. In another embodiment, when the multi-link hinge 150 follows a second path P2, the multi-link hinge 150 may be bent such that a curvature radius of a region 21a guided to an outer circumferential face of the second roller 194 while a movement path is bent is gradually decreased from the first curvature radius R3 to the second curvature radius R4. This may suppress the lifting of the display 130 by allowing a resistance force for the bending of the display 130 to be gradually changed. The paths P1 and P2 of the multi-link hinge 150 illustrated herein may be implemented by a guide groove among the guide grooves 162 and 362 of the first guide structure 160 and/or the guide rail 172 of the second guide structure 170 described in FIG. 5 to FIG. 10.

Figure 22A:
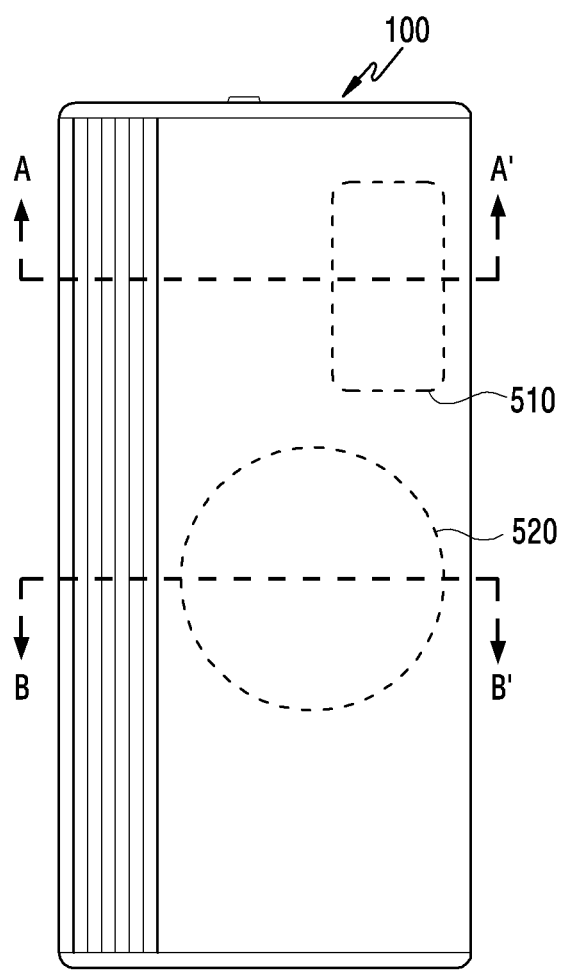
FIGS. 22A, 22B, 22C, 22D, 22E and 22F illustrate a region in which components of an electronic device are mounted according to an embodiment.
Figure 22B:
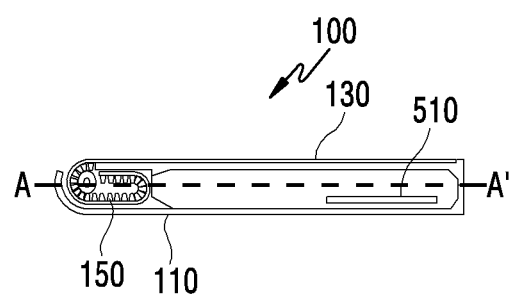
Figure 22C:
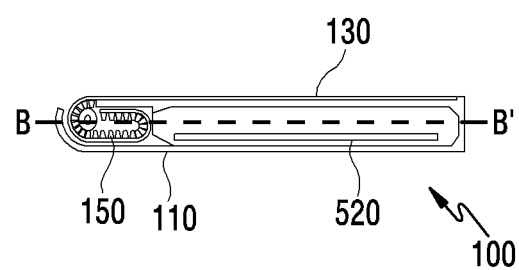
Figure 22D:
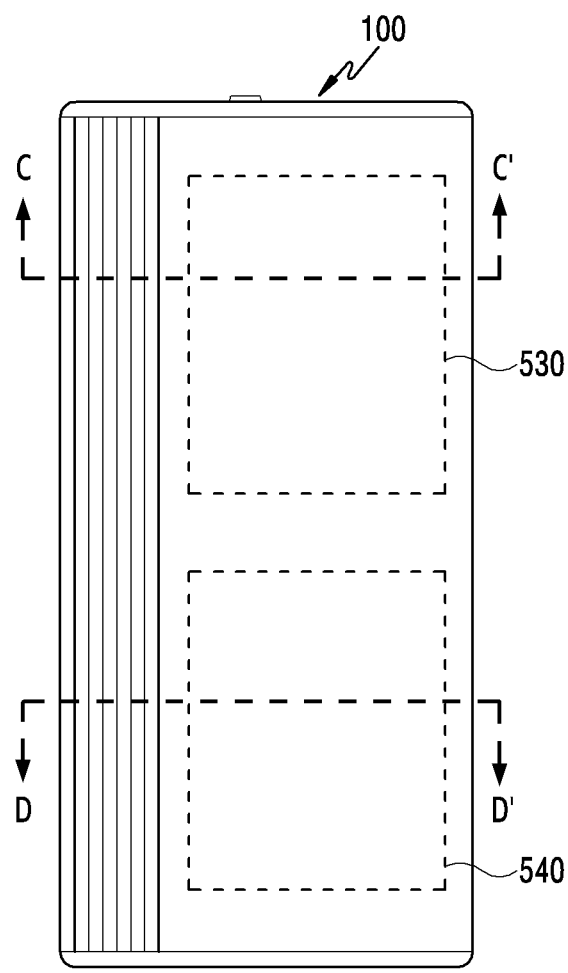
Figure 22E:
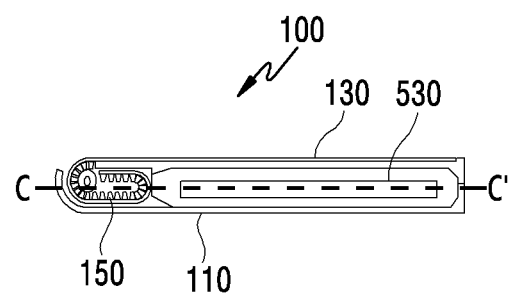
Figure 22F:
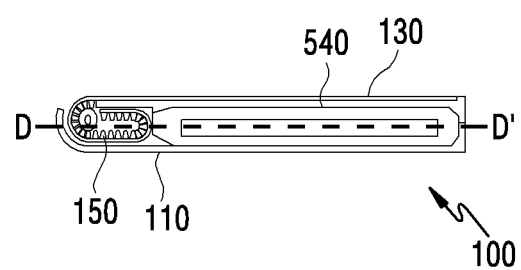

FIGS. 22A, 22B, 22C, 22D, 22E and 22F illustrate regions in which functional components of the electronic device 100 are mounted according to an embodiment. FIG. 22(A) is a plan view illustrating a region in which a camera as a functional component and a coil as a functional component are disposed. FIG. 22(B) illustrates a cross-section taken along line A-A' of FIG. 22(A). FIG. 22(C) illustrates a cross-section taken along line B-B' of FIG. 22(A). FIG. 22(D) is a plan view illustrating a region in which a circuit as a functional component and a battery as a functional component are mounted. FIG. 22(E) illustrates a cross-section taken along line C-C' of FIG. 22(D). FIG. 22(F) illustrates a cross-section taken along line D-D' of FIG. 22D.

The electronic device 100 according to various embodiments may secure at least one of a camera mounting region 510, a coil or antenna mounting region 520, a circuit board mounting region 530, and a battery mounting region 540, which are not influenced by the display 130 due to a decrease in a space occupied by the display 130 drawn inside by being guided by the multi-link hinge 150.

The camera mounting region 510 may mean a region for mounting a camera module (e.g., an optical system and a module including an image sensor). The coil or antenna mounting region 520 may mean a region capable of mounting a coil for receiving wireless charging power or a coil or antenna for performing wireless communication. The circuit board mounting region may mean a space capable of mounting a board (e.g., a printed circuit board) inside the electronic device 100. The battery mounting region 540 may mean a space capable of mounting a battery for supplying power to the electronic device 100.

An electronic device according to various embodiments may include a housing having a first width in a first direction, a flexible display slidably coupled to the housing and including a first portion exposed outside the housing, and a second portion extending from the first portion and drawn into or drawn out of the housing as the first portion slides against the housing, a first roller disposed inside the housing and about a first shaft adjacent to an end portion of the housing in the first direction of the housing, and a second roller disposed inside the housing and about a second shaft spaced apart from the first shaft in a second direction which is opposite to the first direction. The second portion of the flexible display may be bent with a curvature radius in accordance with a radius of the first roller and is guided to be drawn into the housing. Part of the second portion drawn into the housing may be disposed to be guided to the second roller.

In an embodiment, the electronic device includes a housing having an end portion, a flexible display slidably coupled to the housing, the flexible display including a first portion exposed outside the housing and slidable along a sliding direction in both a direction away from and in a direction toward the end portion of the housing, and a second portion which is connected to the first portion, the second portion being extendable out of the housing and retractable into the housing together with sliding of the first portion of the flexible display along the sliding direction, a plurality of rollers inside the housing and along which the flexible display is movable in both extension and retraction of the flexible display respectively out of and into the housing, the plurality of rollers including a first roller inside the housing and rotatable about a first shaft adjacent to the end portion of the housing, the first roller having a first radius of curvature, and a second roller which is inside the housing and rotatable about a second shaft spaced apart from the first shaft along the sliding direction, the second shaft being further from the end portion of the housing than the first shaft. The retraction of the flexible display into the housing extends the second portion of the flexible display along the first roller to have a curvature corresponding the first radius of curvature of the first roller, together with the second portion of the flexible display being extended along the second roller.

According to various embodiments, the first roller may be constructed to have a first radius. The second roller may be constructed to have a second radius smaller than the first radius. That is, the second roller may have a second radius of curvature which is smaller than the first radius of curvature of the first roller.

The electronic device according to various embodiments may further include a slide plate attached to a rear face of the first portion, and a multi-link hinge of which one face is attached to a rear face of the second portion and of which the other face is in contact with an outer circumferential face of the first roller or second roller. That is, the electronic device may include a slide plate which is attached to the flexible display at the first portion and is slidably coupled to the housing, and a multi-link sliding member which is attached to the flexible display at the second portion and moveable together with the flexible display, the multi-link sliding member including a mounting face at which the second portion is attached to the multi-link sliding member, and a roller face which contacts the first roller or the second roller.

The electronic device according to various embodiments may further include a first guide structure including a guide groove configured to accommodate part of the multi-link hinge. The multi-link hinge may include a plurality of bars parallel to the flexible display and extending in a direction perpendicular to the first direction. Each of the bars may include protrusions extending in a lengthwise direction of the bar at both ends. The protrusion may be accommodated at least in part in the guide groove, and the multi-link hinge is guided by the guide groove.

In an embodiment, the electronic device may further include a plurality of guide plates spaced apart from each other in a direction crossing the sliding direction, each of the plurality of guide plates extending lengthwise along the sliding direction and defining a guide groove along which the multi-link sliding member slides. The multi-link sliding member may further include a plurality of bars parallel to the flexible display and extending in the direction crossing the sliding direction, the plurality of bars moveable together with each other along the first roller or the second roller, together with sliding of the flexible display, and each bar among the plurality of bars includes opposing ends along the direction crossing the sliding direction, and a protrusion at each of the opposing ends, the protrusions of the each bar being engaged with a respective guide groove of the plurality of guide plates.

The electronic device according to various embodiments may further include a second guide structure including a guide rail. The plurality of bars may include a hook capable of being caught at the guide rail. The multi-link hinge may be guided by the guide rail. That is, the electronic device may further include a guide rail which is between the plurality of guide plates and spaced apart from each of the plurality of guide plates, along the direction crossing the sliding direction, and the each bar among the plurality of bars further includes a hook which engages with the guide rail and is slidably disposed with the guide rail.

The electronic device according to various embodiments may further include a support member disposed inside the housing. The first guide structure and the second guide structure may be fixedly coupled to the support member. The slide plate may be movably coupled to the support member. In an embodiment, the electronic device may further include a support member which is inside the housing and faces the first portion of the flexible display with the slide plate therebetween. The plurality of guide plates and the guide rail may be fixedly coupled to the support member, and the slide plate may be movably coupled to the support member.

The electronic device according to various embodiments includes a tension band having one end coupled to the first shaft and the other end coupled to a portion of the flexible display, and coupled to both ends of the first shaft to rotate the first shaft according to rotation of the first shaft. An elastic member providing an elastic force to the shaft may be further included.

In an embodiment, the electronic device may further include a tension band which extends along the sliding direction and provides a tension to the flexible display in a direction towards the end portion of the housing, the tension band coupled to the first shaft at a first end of the tension band and to the flexible display at a second end of the tension band which is opposite to the first end of the tension band, the first shaft may including opposing ends along the direction crossing the sliding direction, and an elastic member which is coupled to both of the opposing ends of the first shaft and provides an elastic force of the first shaft according to rotation of the first shaft.

The electronic device according to various embodiments may further include a third roller coupled to the first shaft and having a smaller outer circumferential radius than an outer circumferential radius of the first roller. The tension band may be coupled to the third roller. That is, the electronic device may further include a third roller which is coupled to the first shaft and is adjacent to the first roller along the first shaft, the third roller having an outer circumferential radius smaller than an outer circumferential radius of the first roller, and the first end of the tension band being coupled to the third roller.

According to various embodiments, the elastic member may further include a static load spring. One end of the static load spring may be coupled to the first roller, and the other end may be coupled to the first guide structure. That is, the static load spring may be coupled to the first roller at a first end of the static load spring, and to a guide plate among the plurality of guide plates at a second end of the static load spring which is opposite to the first end of the static load spring. According to various embodiments, the tension band may include a PET sheet or a PU sheet (e.g., polyethylene or polyurethane).

The electronic device according to various embodiments may further include a first member (e.g., a fixing member) disposed on the tension band. The tension band may be coupled to a multi-link hinge through the first member. In an embodiment, the electronic device may further include a fixing member which faces a bar among the plurality of bars of the multi-link sliding member, with the tension band therebetween. Coupling of the fixing member to the bar of the multi-link sliding member may couple the tension band to the multi-link sliding member.

According to various embodiments, among a plurality of bars constructing the multi-link hinge, a first contact back which is first in contact with the second roller may include a first face at a side face. When the first contact bar encounters the second roller, the first contact bar may be disposed to be mounted on the second roller through the first face.

According to various embodiments, the guide groove may be constructed such that a curvature of a region which guides the multi-link hinge to an outer circumferential face of the second roller changes gradually.

The electronic device according to various embodiments may further include a protrusion disposed on an outer circumferential face of the first roller and inserted to a gap between bars constructing the multi-link hinge.

In an embodiment, for example, the first roller may include a protrusion radially extended from an outer surface of the first roller, the multi-link sliding member may further include a plurality of bars parallel to the flexible display and extending in the direction crossing the sliding direction, the plurality of bars moveable together with each other along the first roller or the second roller, together with sliding of the flexible display, and a gap defined between adjacent bars among the plurality of bars of the multi-link sliding member, and movement of the plurality of bars of the multi-link sliding member along the first roller may inserts the protrusion of the first roller into the gap which is defined between the adjacent bars.

According to various embodiments, the first roller may include a plurality of protrusions protruding on an outer circumferential face. When the multi-link hinge passes the first roller, the plurality of protrusions may be disposed to be accommodated at least in part between bars of the multi-link hinge.

In an embodiment, for example, the first roller may include a plurality of protrusions radially extended from an outer surface of the first roller, the multi-link sliding member may further include a plurality of bars parallel to the flexible display and extending in the direction crossing the sliding direction, and the plurality of bars moveable together with each other along the first roller or the second roller, together with sliding of the flexible display, and movement of the plurality of bars of the multi-link sliding member along the first roller may define a plurality of recesses between adjacent bars among the plurality of bars, together with inserting the plurality of protrusions of the first roller and respectively into the plurality of recesses.

According to various embodiments, the first roller may include a plurality of recesses recessed from the outer circumferential face towards a rotational center. A plurality of bars of the multi-link hinge may include protruding portions accommodatable at least in part in the recess.

In an embodiment, the first roller may include a plurality of recesses recessed from an outer surface of the first roller, the multi-link sliding member may further include a plurality of bars parallel to the flexible display and extending in the direction crossing the sliding direction, the plurality of bars moveable together with each other along the first roller or the second roller, together with sliding of the flexible display, and each bar among the plurality of bars includes a protruding portion, and movement of the plurality of bars of the multi-link sliding member along the first roller may insert the protruding portions of the plurality of bars respectively into the plurality of recesses of the first roller.

According to various embodiments, the multi-link hinge may include an auxiliary bar disposed between a plurality of bars constructing the multi-link hinge. The auxiliary bar may be constructed to be accommodated at least in part inside the plurality of bars or protrude from the plurality of bars according to a curvature of a curved face constructed by the plurality of bars.

In an embodiment, the multi-link sliding member may further include a plurality of bars parallel to the flexible display and extending in the direction crossing the sliding direction, adjacent bars among the plurality of bars defining a gap therebetween, a plurality of auxiliary bars parallel to the flexible display and extending in the direction crossing the sliding direction, each of an auxiliary bar among the plurality of auxiliary bars moveable into and out of the gap between the adjacent bars, and the plurality of bars and the plurality of auxiliary bars moveable together with each other along the first roller or the second roller.

According to various embodiments, the plurality of bars may be disposed such that an interval between neighboring bars constructed when passing the first roller is greater than an interval between neighboring bars constructed when passing the second roller. When the multi-link hinge passes the first roller, the auxiliary bar may be configured to be accommodated at least in part in the interval.

In an embodiment, referring to the views of FIG. 22, for example, the multi-link sliding member may further include a first group of bars, a second group of bars and a third group of bars among the plurality of bars, in order from the slide plate, along the multi-link sliding member, the first group of bars, the second group of bars and the third group of bars respectively including first adjacent bars defining a first gap therebetween, second adjacent bars defining a second gap therebetween, and third adjacent bars defining a third gap therebetween, and among the plurality of auxiliary bars a first auxiliary bar fully inserted into the first gap between the first adjacent bars in the first group of bars, together with a second auxiliary bar protruding out of the second gap between the second adjacent bars in the second group of bars, and a third auxiliary bar fully outside of the third gap between the third adjacent bars in the third group of bars.

In an embodiment, each of the plurality of bars and each of the plurality of auxiliary bars includes a mounting face which is closest to the flexible display, and the mounting face of the first auxiliary bar fully inserted into the first gap is coplanar with the mounting faces of the first adjacent bars. T second group of bars and the second auxiliary bar may face the first roller, together with the third group of bars and the third auxiliary bar facing the second roller.

The electronic device according to various embodiments may further include a battery spaced apart from the second shaft inside the housing in a direction opposite to a direction in which the first shaft is disposed.

The electronic device according to various embodiments may further include a wireless charging coil spaced apart from the second shaft inside the housing in a direction opposite to a direction in which the first shaft is disposed.

In an embodiment, the electronic device may further include a functional component which provides a function to the electronic device, and the functional component may be within the housing and further from the end portion of the housing than each of the plurality of rollers. Here, the functional component may include a camera module, an optical system, an image sensor, a coil which receives wireless charging power, a coil or antenna which performs wireless communication, a circuit board or a battery.

An external electronic device according to various embodiments disclosed in the disclosure may be one of various types of electronic devices. An electronic devices may include, for example, a portable communication device (e.g., a smart phone), a computer device, a portable multimedia device, a portable medical device, a camera, a wearable device, or a home appliance. According to an embodiment of the disclosure, the electronic device or the external electronic device is not limited to the aforementioned devices.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. For example, a reference number labeling a singular form of an element within the figures may be used to reference a plurality of the singular element within the text of the disclosure.

It is to be understood that a singular form of a noun corresponding to an item may include one or more of the things, unless the relevant context clearly indicates otherwise. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As used herein, such terms as "1st" and "2nd," or "first" and "second" may be used to simply distinguish a corresponding component from another, and does not limit the components in other aspect (e.g., importance or order).

It is to be understood that if an element (e.g., a first element) is referred to, with or without the term "operatively" or "communicatively", such as "coupled with," "coupled to," "connected with," or "connected to" another element (e.g., a second element), it means that the element may be coupled with the other element directly (e.g., wiredly), wirelessly, or via a third element. In contrast, when an element is referred to as being related "directly coupled with," "directly coupled to," "directly connected with," or "directly connected to" another element (e.g., a second element), it means that the element may be coupled without a third element therebetween. Elements which are in contact with each other may form an interface therebetween.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

The invention claimed is:

1. An electronic device comprising:
   a housing having an end portion;
   a flexible display slidably coupled to the housing, the flexible display comprising:
      a first portion exposed outside the housing and slidable along a sliding direction in both a direction away from and in a direction toward the end portion of the housing, and
      a second portion which is connected to the first portion, the second portion being extendable out of the housing and retractable into the housing together with sliding of the first portion of the flexible display along the sliding direction;
   a plurality of rollers inside the housing and along which the flexible display is movable in both extension and retraction of the flexible display respectively out of and into the housing, the plurality of rollers comprising:
      a first roller inside the housing and rotatable about a first shaft adjacent to the end portion of the housing, the first roller having a first radius of curvature; and
      a second roller which is inside the housing and rotatable about a second shaft spaced apart from the first shaft along the sliding direction, the second shaft being further from the end portion of the housing than the first shaft; and
   a multi-link sliding member which is attached to the flexible display at the second portion and moveable together with the flexible display,
   wherein the retraction of the flexible display into the housing extends the second portion of the flexible display along the first roller to have a curvature corresponding the first radius of curvature of the first roller, and extends each of a portion of the multi-link sliding member and a part of the second portion of the flexible display along the second roller and between the second roller and the first portion of the flexible display.

2. The electronic device of claim 1, wherein the second roller has a second radius of curvature which is smaller than the first radius of curvature of the first roller.

3. The electronic device of claim 1, further comprising:
   a slide plate which is attached to the flexible display at the first portion and is slidably coupled to the housing; and
   the retraction of the flexible display into the housing extends each of the portion of the multi-link sliding member and the part of the second portion of the flexible display along the second roller and between the second roller and the slide plate.

4. The electronic device of claim 3, further comprising:
   a plurality of guide plates spaced apart from each other in a direction crossing the sliding direction, each of the plurality of guide plates extending lengthwise along the sliding direction and defining a guide groove along which the multi-link sliding member slides, and
   the multi-link sliding member further comprises:
      a plurality of bars parallel to the flexible display and extending in the direction crossing the sliding direction,
      the plurality of bars moveable together with each other along the first roller or the second roller, together with sliding of the flexible display, and
      each bar among the plurality of bars includes opposing ends along the direction crossing the sliding direction, and a protrusion at each of the opposing ends, the protrusions of the each bar being engaged with a respective guide groove of the plurality of guide plates.

5. The electronic device of claim 4, further comprising:
   a guide rail which is between the plurality of guide plates and spaced apart from each of the plurality of guide plates, along the direction crossing the sliding direction, and
   the each bar among the plurality of bars further includes a hook which engages with the guide rail and is slidably disposed with the guide rail.

6. The electronic device of claim 5, further comprising:
   a support member which is inside the housing and faces the first portion of the flexible display with the slide plate therebetween,
   wherein
      the plurality of guide plates and the guide rail are fixedly coupled to the support member, and
      the slide plate is movably coupled to the support member.

7. The electronic device of claim 4, further comprising:
   a tension band which extends along the sliding direction and provides a tension to the flexible display in a direction towards the end portion of the housing, the tension band coupled to the first shaft at a first end of the tension band and to the flexible display at a second end of the tension band which is opposite to the first end of the tension band;
   the first shaft including opposing ends along the direction crossing the sliding direction; and
   an elastic member which is coupled to both of the opposing ends of the first shaft and provides an elastic force of the first shaft according to rotation of the first shaft.

8. The electronic device of claim 7, further comprising:
a third roller which is coupled to the first shaft and is adjacent to the first roller along the first shaft,
the third roller having an outer circumferential radius smaller than an outer circumferential radius of the first roller,
the first end of the tension band being coupled to the third roller.

9. The electronic device of claim 8, wherein
the elastic member comprises a static load spring, and
the static load spring is coupled to the first roller at a first end of the static load spring, and to a guide plate among the plurality of guide plates at a second end of the static load spring which is opposite to the first end of the static load spring.

10. The electronic device of claim 8, wherein the tension band comprises polyethylene or polyurethane.

11. The electronic device of claim 8, further comprising:
a fixing member which faces a bar among the plurality of bars of the multi-link sliding member, with the tension band therebetween,
wherein coupling of the fixing member to the bar of the multi-link sliding member couples the tension band to the multi-link sliding member.

12. The electronic device of claim 3, wherein
the first roller comprises a protrusion radially extended from an outer surface of the first roller,
the multi-link sliding member further comprises:
  a plurality of bars parallel to the flexible display and extending in the direction crossing the sliding direction,
  the plurality of bars moveable together with each other along the first roller or the second roller, together with sliding of the flexible display, and
  a gap defined between adjacent bars among the plurality of bars of the multi-link sliding member, and
movement of the plurality of bars of the multi-link sliding member along the first roller inserts the protrusion of the first roller into the gap which is defined between the adjacent bars.

13. The electronic device of claim 3, wherein
the first roller comprises a plurality of protrusions radially extended from an outer surface of the first roller,
the multi-link sliding member further comprises:
  a plurality of bars parallel to the flexible display and extending in the direction crossing the sliding direction, and
  the plurality of bars moveable together with each other along the first roller or the second roller, together with sliding of the flexible display, and
movement of the plurality of bars of the multi-link sliding member along the first roller defines a plurality of recesses between adjacent bars among the plurality of bars and inserts the plurality of protrusions of the first roller respectively into the plurality of recesses.

14. The electronic device of claim 3, wherein
the first roller comprises a plurality of recesses recessed from an outer surface of the first roller,
the multi-link sliding member further comprises:
  a plurality of bars parallel to the flexible display and extending in the direction crossing the sliding direction,
  the plurality of bars moveable together with each other along the first roller or the second roller, together with sliding of the flexible display, and
  each bar among the plurality of bars includes a protruding portion, and
movement of the plurality of bars of the multi-link sliding member along the first roller inserts the protruding portions of the plurality of bars respectively into the plurality of recesses of the first roller.

15. The electronic device of claim 3, wherein the multi-link sliding member further comprises:
  a plurality of bars parallel to the flexible display and extending in the direction crossing the sliding direction,
  adjacent bars among the plurality of bars defining a gap therebetween,
  a plurality of auxiliary bars parallel to the flexible display and extending in the direction crossing the sliding direction, each of an auxiliary bar among the plurality of auxiliary bars moveable into and out of the gap between the adjacent bars, and
  the plurality of bars and the plurality of auxiliary bars moveable together with each other along the first roller or the second roller.

16. The electronic device of claim 15, wherein the multi-link sliding member further comprises:
  a first group of bars, a second group of bars and a third group of bars among the plurality of bars, in order from the slide plate, along the multi-link sliding member,
  the first group of bars, the second group of bars and the third group of bars respectively including first adjacent bars defining a first gap therebetween, second adjacent bars defining a second gap therebetween, and third adjacent bars defining a third gap therebetween, and
  among the plurality of auxiliary bars a first auxiliary bar fully inserted into the first gap between the first adjacent bars in the first group of bars, together with a second auxiliary bar protruding out of the second gap between the second adjacent bars in the second group of bars, and a third auxiliary bar fully outside of the third gap between the third adjacent bars in the third group of bars.

17. The electronic device of claim 16, wherein
each of the plurality of bars and each of the plurality of auxiliary bars includes a mounting face which is closest to the flexible display, and
the mounting face of the first auxiliary bar fully inserted into the first gap is co-planar with the mounting faces of the first adjacent bars.

18. The electronic device of claim 16, wherein the second group of bars and the second auxiliary bar face the first roller, together with the third group of bars and the third auxiliary bar facing the second roller.

19. The electronic device of claim 1, further comprising a functional component which provides a function to the electronic device,
wherein the functional component is within the housing and further from the end portion of the housing than each of the plurality of rollers.

20. The electronic device of claim 19, wherein the functional component includes a camera module, an optical system, an image sensor, a coil which receives wireless charging power, a coil or antenna which performs wireless communication, a circuit board or a battery.

* * * * *